(12) United States Patent
Ogura et al.

(10) Patent No.: US 7,936,604 B2
(45) Date of Patent: May 3, 2011

(54) HIGH SPEED OPERATION METHOD FOR TWIN MONOS METAL BIT ARRAY

(75) Inventors: Tomoko Ogura, Hillsboro, OR (US); Nori Ogura, Hillsboro, OR (US); Seiki Ogura, Hillsboro, OR (US); Tomoya Saito, Beaverton, OR (US); Yoshitaka Baba, Beaverton, OR (US)

(73) Assignee: Halo LSI Inc., Hillsboro, OR (US)

( * ) Notice: Subject to any disclaimer, the term of this patent is extended or adjusted under 35 U.S.C. 154(b) by 0 days.

(21) Appl. No.: 11/215,418

(22) Filed: Aug. 30, 2005

(65) Prior Publication Data
US 2007/0047307 A1     Mar. 1, 2007

(51) Int. Cl.
*G11C 11/34* (2006.01)

(52) U.S. Cl. ......... 365/185.05; 365/185.11; 365/185.17; 365/185.18; 365/185.24; 365/185.26; 365/185.33

(58) Field of Classification Search ............. 365/185.03, 365/185.11, 185.17, 185.18, 185.29, 185.01, 365/185.05, 185.16, 185.24, 185.26, 185.33
See application file for complete search history.

(56) References Cited

U.S. PATENT DOCUMENTS

| | | | | |
|---|---|---|---|---|
| 6,011,725 | A | 1/2000 | Eitan | 165/185.33 |
| 6,248,633 | B1 | 6/2001 | Ogura et al. | 438/267 |
| 6,255,166 | B1 * | 7/2001 | Ogura et al. | 365/185.29 |
| 6,388,293 | B1 | 5/2002 | Ogura et al. | 257/365 |
| 6,399,441 | B1 * | 6/2002 | Ogura et al. | 365/185.01 |
| 6,469,935 | B2 * | 10/2002 | Hayashi | 365/185.18 |
| 6,531,350 | B2 | 3/2003 | Satoh et al. | 438/197 |
| 6,631,088 | B2 * | 10/2003 | Ogura et al. | 365/185.18 |
| 6,707,079 | B2 | 3/2004 | Satoh et al. | 257/288 |
| 6,735,118 | B2 * | 5/2004 | Ogura et al. | 365/185.18 |
| 6,756,271 | B1 | 6/2004 | Satoh et al. | 438/258 |
| 6,759,290 | B2 * | 7/2004 | Ogura et al. | 365/185.18 |
| 6,801,455 | B2 * | 10/2004 | Natori | 365/185.18 |
| 6,809,963 | B2 * | 10/2004 | Kanai | 365/185.05 |
| 6,813,188 | B2 * | 11/2004 | Ohtani | 365/185.18 |
| 6,829,165 | B2 * | 12/2004 | Kanai | 365/185.11 |
| 7,006,378 | B1 * | 2/2006 | Saito et al. | 365/185.05 |
| 7,031,198 | B2 * | 4/2006 | Kanai | 365/185.11 |
| 7,075,823 | B2 * | 7/2006 | Harari | 365/185.17 |
| 7,149,126 | B2 * | 12/2006 | Ogura et al. | 365/185.29 |
| 7,180,779 | B2 * | 2/2007 | Telecco et al. | 365/185.18 |
| 7,394,703 | B2 * | 7/2008 | Ogura et al. | 365/185.29 |

FOREIGN PATENT DOCUMENTS

JP      60200566      10/1985

OTHER PUBLICATIONS

Co-pending U.S. Patent App., filed Aug. 30, 2005, U.S. Appl. No. 11/215,528, "Twin MONOS Array for High Speed Applications", assigned to the same assignee as the present invention.

* cited by examiner

*Primary Examiner* — Trong Phan
(74) *Attorney, Agent, or Firm* — Saile Ackerman LLC; Stephen B. Ackerman; Rosemary L. S. Pike

(57) ABSTRACT

The present invention provides a novel operational method of twin MONOS metal bit or diffusion bit structure for high-speed application. In a first embodiment of the present invention, the alternative control gates are set at the same voltage. In a second embodiment of the present invention, all the control gates are set at the operational voltage from the beginning. In both embodiments, the bit line and word gate are used to address the selected memory cell.

18 Claims, 28 Drawing Sheets

| Read method | | Information detected | | | |
|---|---|---|---|---|---|
| L | R | (1) | (2) | (3) | (4) |
| S | D | 0 | 1 | 0 | 1 |
| D | S | 0 | 0 | 1 | 1 |
| Information in the cell | | 0,0 | 1,0 | 0,1 | 1,1 |

|  | WL selected | WL unselected | CG selected | CG override | CG unselected | BL selected | BL override | BL unselected |
|---|---|---|---|---|---|---|---|---|
| Read | 1.8V | 0V | 1.8V | 3.3V | 0V | 0V | 1.8V floating | 1.8V |
| Program | 1V | 0V | 5.5V | 3.3V | 0V | 4.5V | 0V or 1.8V | 1.8V |
| Erase | -2V 1.8V* (*:inhibit) | 1.8V | -3V | 3.0V | 3.0V | 4.5V | 1.8V | 1.8V |

Voltage Condition

*FIG. 9 Prior Art*

| | WL selected | WL unselected | CG selected | CG override | CG unselected | BL selected | BL override | BL unselected |
|---|---|---|---|---|---|---|---|---|
| Read | 1.8V | 0V | 1.8V | 3.3V | 0V | 0V | 1.8V floating | 1.8V |
| Program | 1V | 0V | 5.0V | 3.3V | 0V | 5.0V | 0V or 1.8V | 1.8V |
| Erase | −1V 3.0V* (*:inhibit) | 0V | −3V | 3.3V | 0V | 5.0V | 0V | 1.8V |

Voltage Condition

FIG. 14 Prior Art

| A | Vcg low | Vcg=1.8V<br>Vwg=2.0V | Good ON/OFF ratio<br>(low stand-by current) |
|---|---|---|---|
| B | Vcg=Vwg | Vcg=2.0V<br>Vwg=2.0V | Same as Prior Art |
| C | Vcg>Vwg | Vcg=2.5V<br>Vwg=2.0V | High current and high speed |

US 7,936,604 B2

HIGH SPEED OPERATION METHOD FOR TWIN MONOS METAL BIT ARRAY

BACKGROUND OF THE INVENTION

1) Field of the Invention

The Invention relates to a non-volatile memory cell with Twin MONOS structure, particularly aiming to high-speed application.

2) Description of the Related Art

Ishii et al. introduced the semiconductor memory element and its operation method in JP60200566 wherein two trap sites 51 and 52 exist in the insulator film underneath the gate polysilicon layer as shown in prior art FIG. 1A. The electron can be trapped in each trap site 51 and 52 as shown in FIG.1 A (1)-(4). Shown in each of the figures of FIG. 1A, 1B, and 1C are P-substrate 55 and source and drain regions 53 and 54.

In FIG. 1B, the method to detect the data status of the trap site 51 is shown. Gate 60 is set at high level (typically higher than 1V, hereinafter it is called "H" level) and select line SL 61 is set at low level (hereinafter it is called "L" level) e.g. ground level. And the data line DL 62 is set at "H" level. Vth over the channel region 56 is high because the electrons exist at the trap site 51. Therefore, the MOSFET does not conduct the current even if gate 60 is set at "H" level and data line 62 is kept at "H" level. Depletion region 57 is illustrated.

In FIG. 1C, the method to detect the data status of the trap site 52 is shown. Gate 60 is set at "H" level and select line SL 64 is set at "L" level e.g. ground level. The data line DL 63 is set at "H" level. Ishii et al. found that in spite of electron storage at the drain edge, the current flows when an appropriate voltage is applied and the source side of state can be read as shown in Table 1. This is because the lateral length of electron storage is so small and the drain voltage of ~1V can easily overcome the field by DIBL (Drain Induced Barrier Lowering) as pointed out later in U.S. Pat. No. 6,011,725 (Eitan et al.). Vth over the channel region 58 is low because the electrons do not exist at the trap site 52. Depletion region 59 is shown. Therefore, the MOSFET conducts the current and data line 63 voltage is lowered to "L" level. The DL set at "H" is always at the opposite side of the trap site read. The status wherein data line DL is "H" as shown in FIG. 1B is detected as data "1" and the status wherein data line DL is "L" as shown in FIG. 1C is detected as data "0". Thus, one memory cell can store 2 bits of data. The data storage pattern in the memory cell and the read method in each pattern are shown in FIG. 1D. FIG. 1D illustrates the information detected in each of Figs. 1A (1-4) where the source (S) and drain (D) are on the left (L) or right (R) sides of the figures.

Seiki Ogura et al. introduced Twin MONOS original cell structure and its device operation in U.S. Pat. Nos. 6,255,166, 6,399,441 and 6,388,293 (herein incorporated by reference in their entirety) wherein one memory cell can store two bits of data. The twin MONOS cell consists of a word gate as a select gate, a control gate pair on both sides of the word gate having an ONO memory element underneath, and a bit pair as source/drain diffusion on the other side of the control gate. The control voltages can be applied to the word gate and each of the control gates individually. The authors also provided two different array structures with fabrication methods; diffusion bit array in U.S. Pat. No. 6,248,633 and metal bit array in U.S. Pat. Nos. 6,469,935 and 6,531,350 (herein incorporated by reference in their entirety). In FIGS. 2A-B, the diffusion bit array structure is shown. FIG. 2A shows the cross sectional view of the diffusion bit array structure 65. The diffusion bit array shown in FIG. 2A consists of bit line 69, control gate line 67 having ONO memory element 68 underneath along the bit line 69, and word gate 66 connecting select gates crossing the bit line. The insulation material with lower work function than oxide, such as $Al_2O_3$, $HFO_2$, $TiO_2$ or $Ti_2O_5$, can be utilized as the insulator in memory. Unit cell 70 is shown in FIGS. 2A and 2B.

The schematic diagram of the diffusion bit array 71 is shown in FIG. 2B. It is convenient for high-density application. Metal bit array shown in FIGS. 3-4 consists of word line (WL) running parallel to control gate (CG) line and bit line (BL) crossing word line (WL) and control gate (CG). FIG. 3 shows "2 cells per contact" type of a twin MONOS metal bit line memory array 1 wherein 2 storage sites (one of "hard bits" 201) share one bit line contact 202. FIG. 4 shows "4 cells per contact" type of a twin MONOS metal bit line memory array 2 wherein four storage sites (two of "hard bits" 203) share one bit line contact 204. For the memory element in a metal bit array, the insulation material with lower work function than oxide, such as $Al_2O_3$, $HFO_2$, $TiO_2$ or $Ti_2O_5$, can be utilized as the insulator in memory.

SUMMARY OF INVENTION

It is an objective of the present invention to provide a novel operational method of twin MONOS metal bit array wherein every other control gate is kept at the same operational voltage during the operation and the switching of the memory device is done by the word gate.

It is another objective of the present invention to provide a novel operational method of twin MONOS metal bit array wherein the override control gate voltage is eliminated and DIBL (Drain Induced Barrier Lowering) is utilized for override.

The present invention provides a novel operational method of twin MONOS metal bit structure for high-speed application using a metal bit array. A metal bit structure and its operational method was proposed in U.S. Pat. Nos. 6,469,935 and 6,531,350, assigned to the same assignee as the present invention, wherein 4 memory elements share a contact. The structure is preferred for high-density application. Another type of metal bit structure and its operational method was proposed in U.S. Pat. No. 6,707,079 and co-pending U.S. patent application Ser. No. 11/215528 (Halo-04-003) filed on , Aug. 30, 2005, wherein 2 memory elements share a contact. FIGS. 3-4 show the schematic diagram of the prior art of a twin MONOS metal bit arrays 1 and 2. Both for the diffusion bit array and metal bit array, the insulation material with lower work function than oxide, such as $Al_2O_3$, $HFO_2$, $TiO_2$ or $Ti_2O_5$, can be utilized as the insulator in memory.

In the prior art of a metal bit twin MONOS memory, override voltage and select voltage are needed as the control gate voltages in the operation. FIGS. 5-9 show the prior art of the operational condition of a twin MONOS metal bit array 1. FIGS. 10-14 show the prior art of the operation condition of a twin MONOS metal bit array 2. Selected and unselected cells are shown respectively as 205 and 206 in FIGS. 5, 207 and 208 in FIGS. 6, and 209 and 210 in FIG. 7. FIG. 9 shows the voltage conditions for read, program, and erase as related to FIGS. 5-8. FIG. 14 shows the voltage conditions for read, program, and erase as related to FIGS. 10-13. In the conventional metal bit twin MONOS memory operational method, the operations are initiated by bit line (BL) selection and control gate (CG) selection and word gate (WL) selection for each address. In the prior art, the voltage of the selected control gate, the selected word gate and the selected bit line need to be set at the operational voltage in each operation cycle. The operation cycle time is restricted by the RC constant (resistance times capacitance) of the selected control gate, the selected word gate and the selected bit lines. Especially, the RC constant of the control gate mostly affects the cycle time because the RC constant of the control gate is much bigger than that of the word gate and the bit line. For the reason above, an operational method to reduce or eliminate the factor of the control gate is an important issue for high-speed memory operation. Although metal stitching is useful to solve this problem, the stitch area presents an area penalty.

In a first embodiment of the present invention, the alternative control gates are set at the same voltage. For example, odd numbered control gates are set at the override voltage 3.3V and even numbered control gates are set at the select voltage 1.8V. The memory cells under the even numbered control gates set at the select voltage 1.8V can be accessible. Assembly of the cells under the even numbered control gates can be the virtual bank called "even bank". In the case that odd numbered control gates are set at the select voltage and even numbered control gates are set at the override voltage, the cells under the odd numbered control gates are accessible. Assembly of the cells under the odd numbered control gates can be a virtual bank called "odd bank". In the present invention, the operation cycle time can be smaller than that of the prior art as long as the cells within the same virtual bank are selected. That is because the set up time for the control gate voltage can be eliminated. However, in case of switching from one virtual bank to another one, there will be an additional access time hit because control gate voltages (select, over-ride) need to be switched. That means the memory array in the present invention is characterized by 2 different access times. This could require system level optimization to take full advantage of the memory. In the present invention, metal stitch is less important; thus memory cell area can be saved.

In a second embodiment of the present invention, all the control gates are set at the operational voltage from the beginning and the bit line and word gate are used to address the selected memory cell. Because the set up time for the control gate voltage can be eliminated, the operation cycle time can be short. In the prior art of a metal bit twin MONOS memory 1 and 2, two types of control gate voltages (select voltage and override voltage) are necessary. This results in complicated operation and a peripheral circuit. The second embodiment of the present invention provides the operational method wherein override voltage is eliminated. All the control gates are set at the intermediate voltage, e.g. 2.5V. That is, all the control gates are connected together electrically. Override happens by reverse read and DIBL. The switching of the memory cell is done by word gate voltage that can be controlled independently of the control gate voltage. Thus, the operation can be simplified and the access time can be shorter because the control gates with huge RC time constants are not driven at all. Furthermore, the peripheral circuits can be simpler. And, even in the present invention, random access capability is attained.

In a third embodiment of high-speed memory operation method using metal bit twin MONOS array where a pair of storage area regions hold complementary bits. Hereinafter, this method is called "complementary method".

BRIEF DESCRIPTION OF THE DRAWINGS

FIGS. 5-8 and FIG. 9 show the operational conditions of the twin MONOS metal bit array of FIG. 3.

FIGS. 10-13 and FIG. 14 show the operational conditions of the twin MONOS metal bit array of FIG. 4.

DETAILED DESCRIPTION OF THE PREFERRED EMBODIMENT

Figure 15:
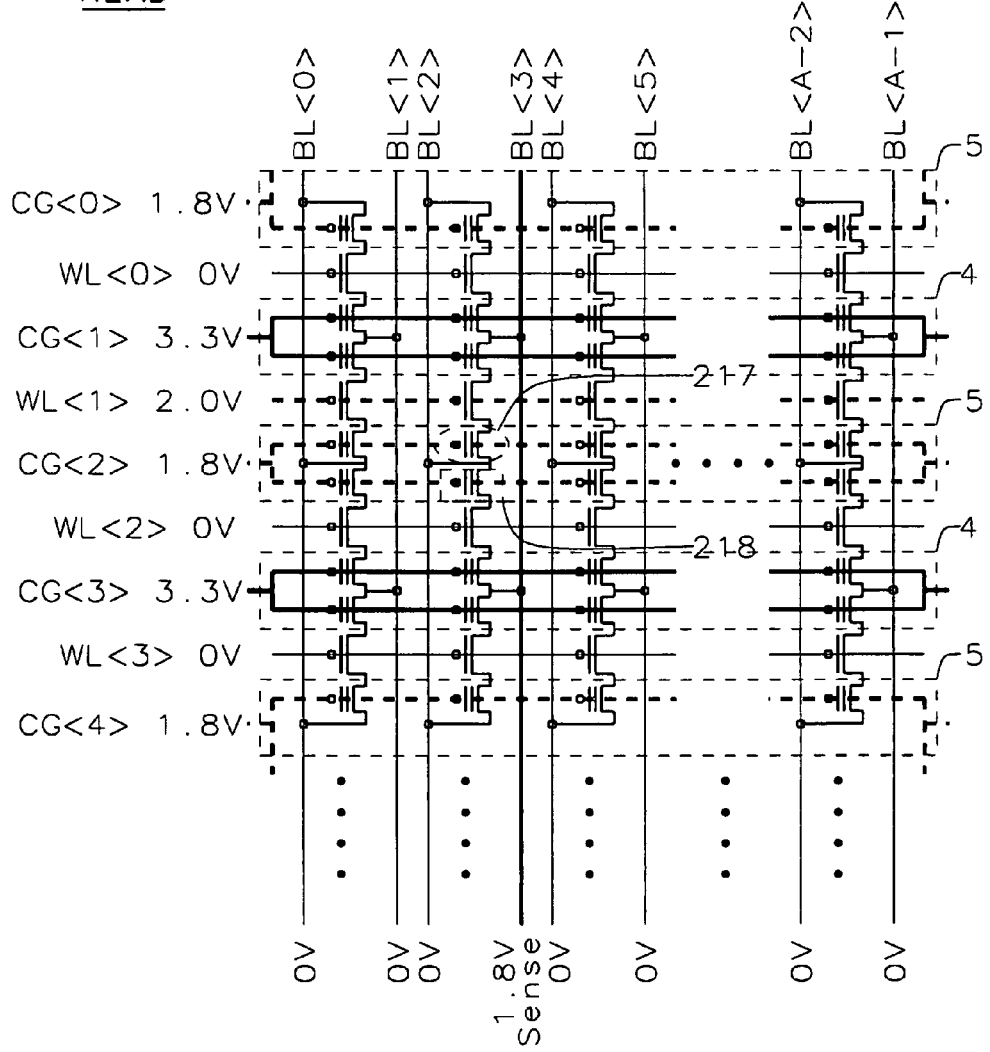
FIG. 15 is a schematic diagram showing the read condition of the first preferred embodiment of the present invention for the metal bit array of FIG. 3.

In a first embodiment of the present invention, FIG. 15 shows the read operation voltage condition in a twin MONOS memory array 1. The selected cell 217 is supposed to be read. The cell 218 under the selected control gate CG<2> is not selected. In FIG. 15, the even numbered control gates are set at the select voltage 1.8V and the odd numbered control gates are set at the override voltage 3.3V at the beginning of the read mode. The assembly of the cells under the even numbered control gate can be thought of as virtual "even bank" 5. The assembly of the cells under the odd numbered control gate can be thought of as virtual "odd bank" 4. The selected bit line BL<3>is precharged at 1.8V before the selected word gate WL<1>is turned on. The unselected bit lines are set at 0V. After the selected bit line BL<3>is precharged at 1.8V, the selected word gate WL<1>is set at 2V. The unselected WL's are set at 0V. The voltage level of the selected Bit line BL<3>is detected by a sense amplifier after the selected word gate WL<1>is turned on, and thus the read operation can be accomplished. Another sensing method, for example, a current sensing method referred to in U.S. Pat. No. 6,631,088 B2 (S.Ogura et al.), herein incorporated by reference in its entirety, and a source follower sensing method, can be also applicable (figure not shown). As long as the even numbered control gates are set at the select voltage 1.8V, any cell in "even bank" 5 (that is, under the even numbered control gates) can be read by selecting the proper word gate and the bit line. Additionally, any cell in "odd bank" 4 (that is, under the odd numbered control gates) can be read by selecting the proper word gate and the bit line if the select voltage is applied at the odd numbered control gates and the override voltage is applied at the even numbered control gates (figure not shown).

Although the memory array is divided into two "even" and "odd" virtual banks in the description above, the number of the virtual banks is not restricted to two. The memory array can be divided into more than two virtual banks.

Figure 6:
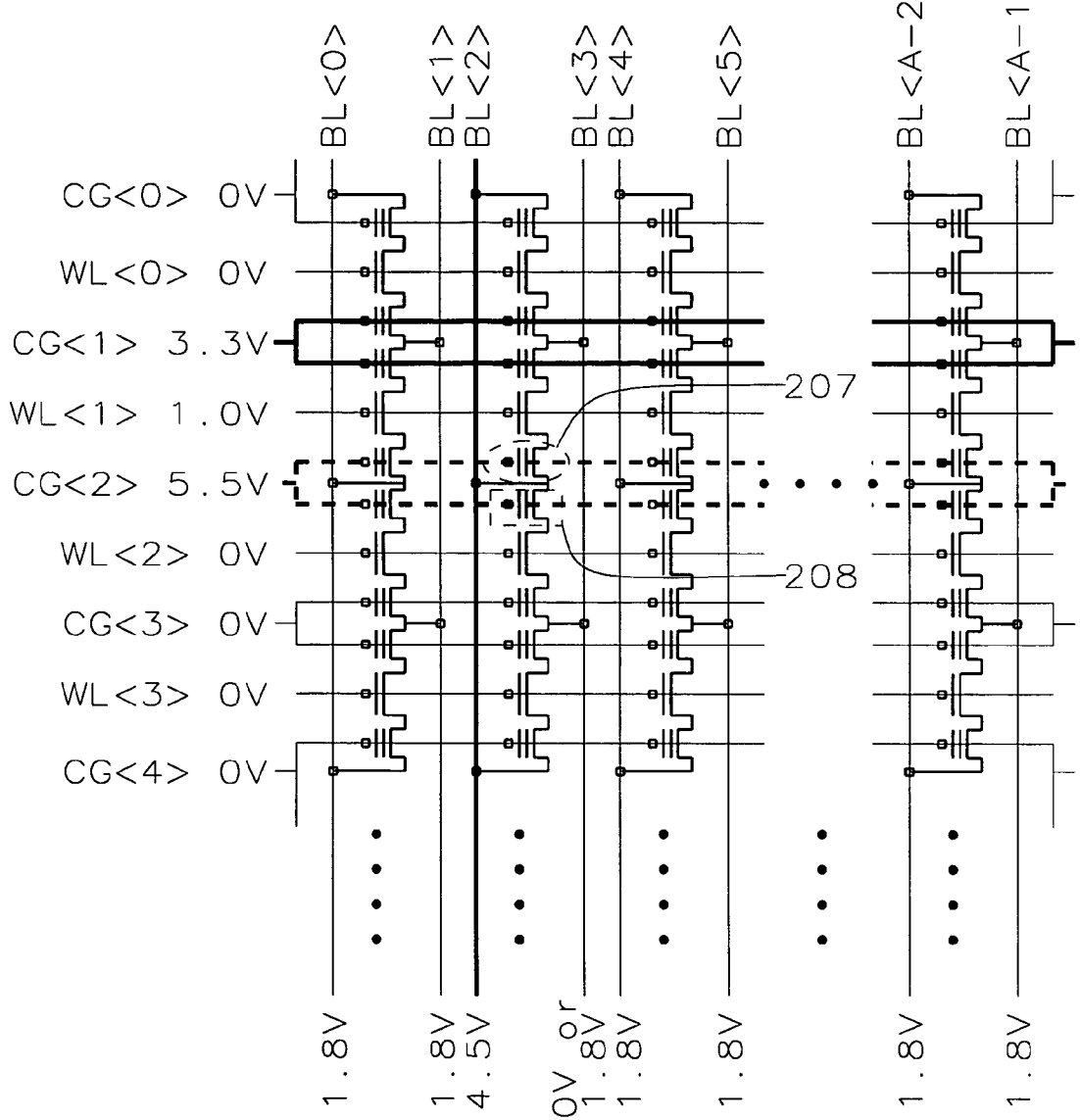

The program operation condition is the same as in the prior art shown in FIG. 6. The erase condition is the same as in the prior art shown in FIG. 7. Furthermore, the erase (block) condition is the same as in the prior art shown in FIG. 8.

Figure 16:
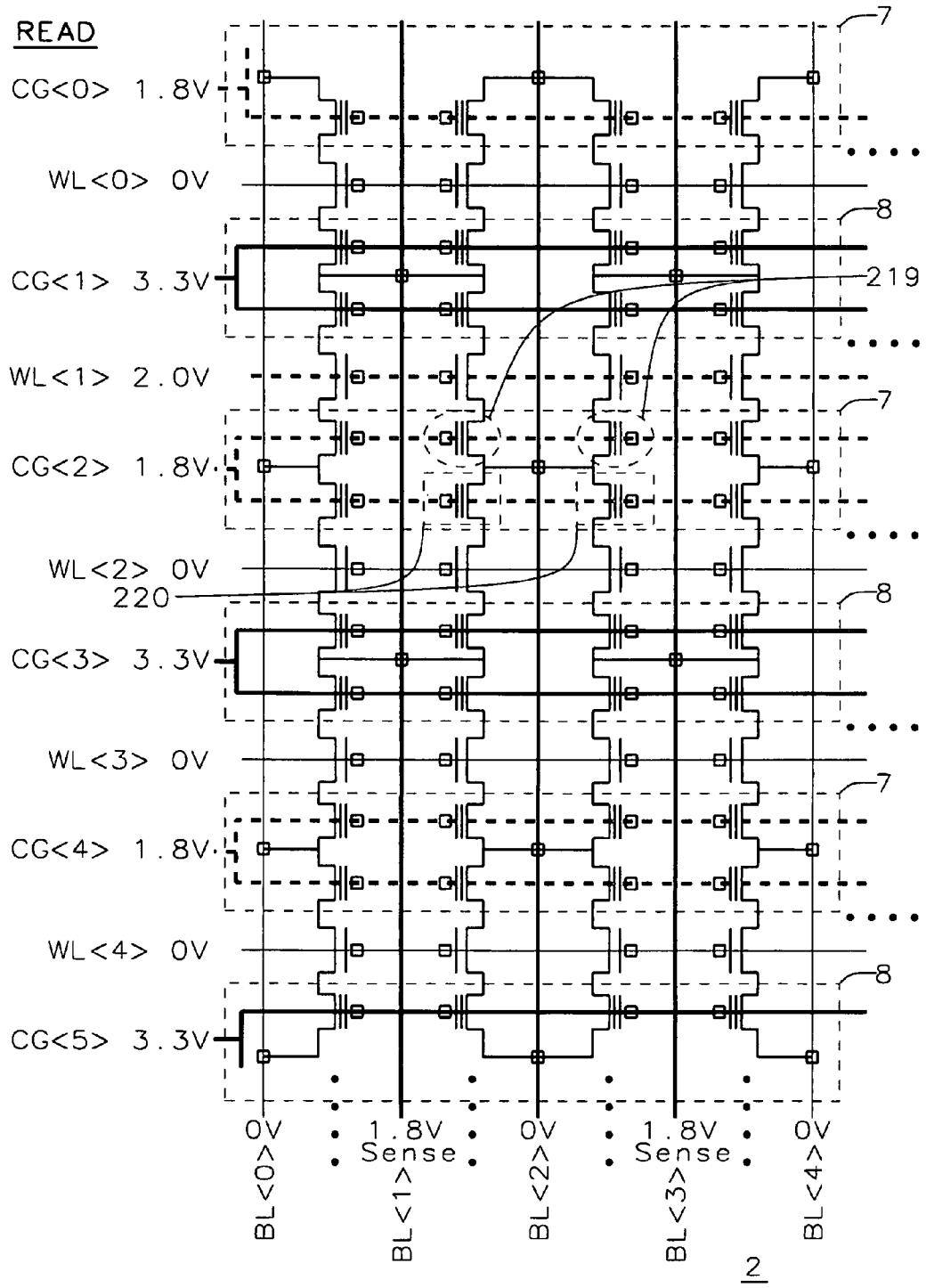
FIG. 16 is a schematic diagram showing the read condition of the first preferred embodiment of the present invention for the metal bit array of FIG. 4.

FIG. 16 shows the read operation voltage condition in a twin MONOS memory array 2.

The basic operation method in the prior art refers to U.S. Pat. No. 6,469,935 B2 (Y. Hayashi) and U.S. Pat. No. 6,631,088 B2 (S. Ogura et al.), herein incorporated by reference in their entirety. The selected cells 219 are supposed to be read at the same time. The cells 220 under the selected control gate CG<2>are not selected. In FIG. 16, the even numbered control gates are set at the select voltage 1.8V and the odd numbered control gates are set at the override voltage 3.3V. The assembly of the cells under the even numbered control gate can be thought of as virtual "even bank" 7. The assembly of the cells under the odd numbered control gate can be thought of as virtual "odd bank" 8. The first selected bit line BL<2>is set at 0V. The second selected bit line BL<1>and the third selected bit line BL<3>are precharged at 1.8V before the selected word gate WL<1>is turned on. The unselected bit lines are set at 0V. After the second selected bit line BL<1>and the third selected bit line BL<3>are precharged at 1.8V, and the selected word gate WL<1>is set at 2V. The unselected WL's are set at 0V. The voltage levels of the second selected bit line BL<1>and the third selected BL<3>are detected by a sense amplifier after the selected word gate WL<1>is turned on, and thus the read operation can be accomplished. Another sensing method, for example, current sensing method referred to in U.S. Pat. No. 6,631,088 B2 and source follower sensing method, can be also applicable (figure not shown). As long as the even numbered control gates are set at the select voltage 1.8V, any cell in "even bank" 7 (that is, under the even numbered control gates) can be read by selecting the proper word gate and the bit line. Additionally, any cell in "odd bank" 8 (that is, under the odd numbered control gates) can be read by selecting the proper word gate and the bit line if the select voltage is applied at the odd numbered control gates and the override voltage is applied at the even numbered control gates (figure not shown).

Figure 17:
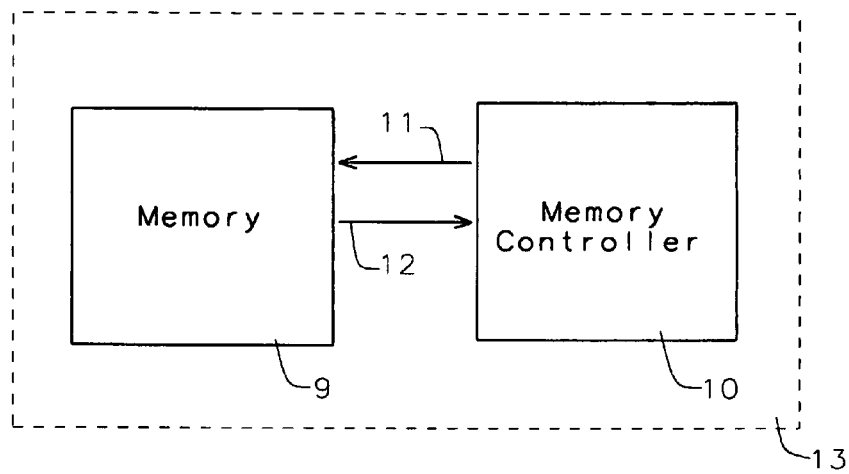
FIG. 17 is a block diagram of the operation of the memory controller in the first preferred embodiment of the present invention.

FIG. 17 shows the application system 13 configuration using memory module 9 and memory controller 10. Memory array 1 shown in FIG. 15 and memory array 2 shown in FIG. 16 are used for memory module 9 shown in FIG. 17. The operation cycle time of the present invention can be shorter than that of the prior art if the operation is done within the same virtual "bank" because the control gate voltage set up time is not necessary for the present invention. However, in case of switching from one virtual bank to another one, there will be an additional access time hit because the control gate voltages (select, override) need to be switched. That means the memory array in the present invention is characterized by two different read access times. This could require system level optimization to take full advantage of the memory. During the system 13 operation, memory controller 10 needs to get the system codes 12 from the memory 9. For the optimal performance of the whole system 13, the system codes 11 which are necessary for a certain operation should not be split into two virtual banks. The system codes 11 should be put into one of the two virtual banks in the memory module 9 by the controller 10 so that the controller 10 can avoid an access time hit occurring in addressing the other virtual bank in the memory module 9. Moreover, for any other kind of data, the controller 10 should assign a group of data to one of the virtual banks in the memory module 9 if these data need to be read out at once during the system 13 operation. In the present invention, metal stitch is less important and memory cell area can be saved.

Figure 12:
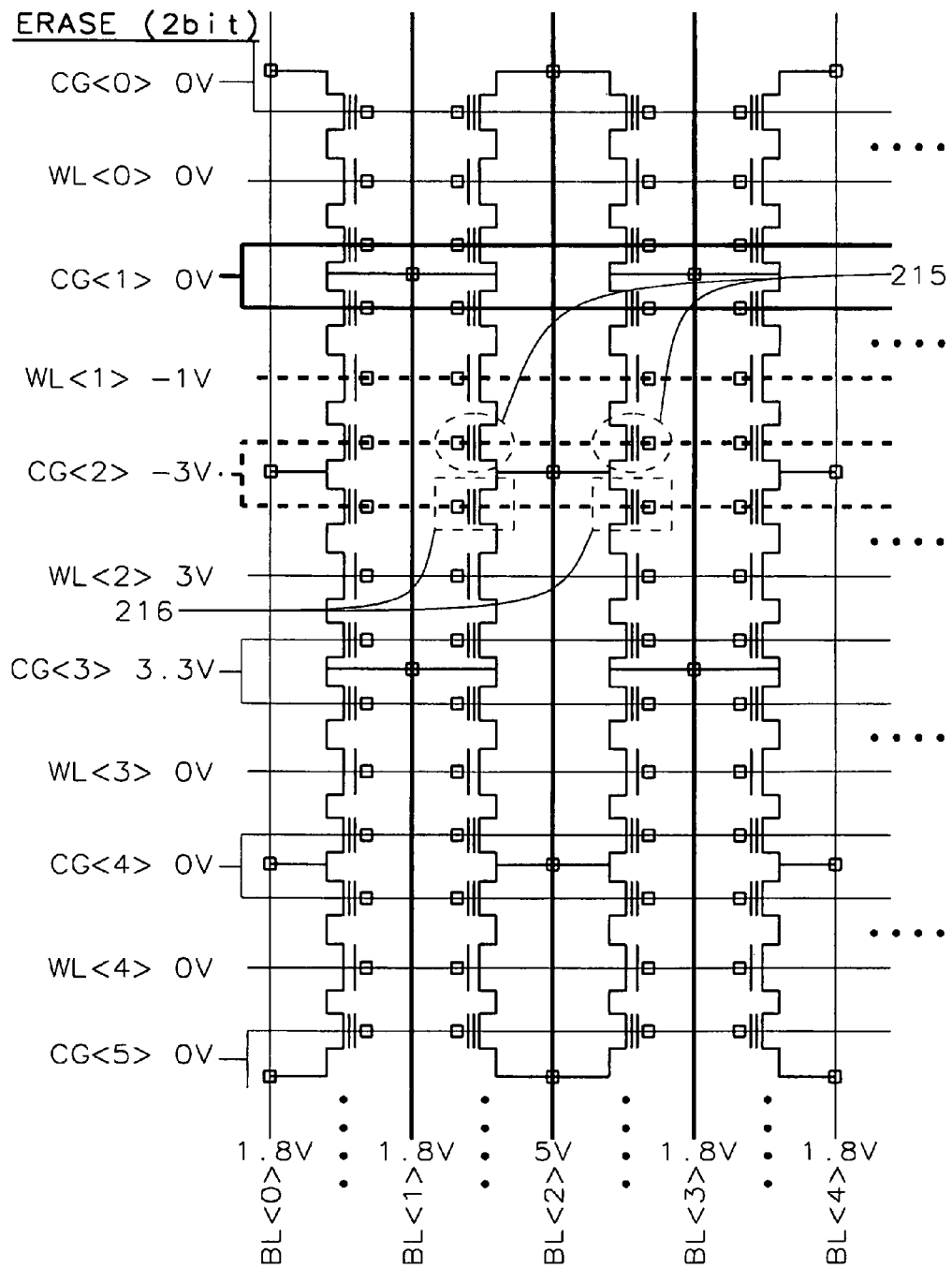
Figure 13:
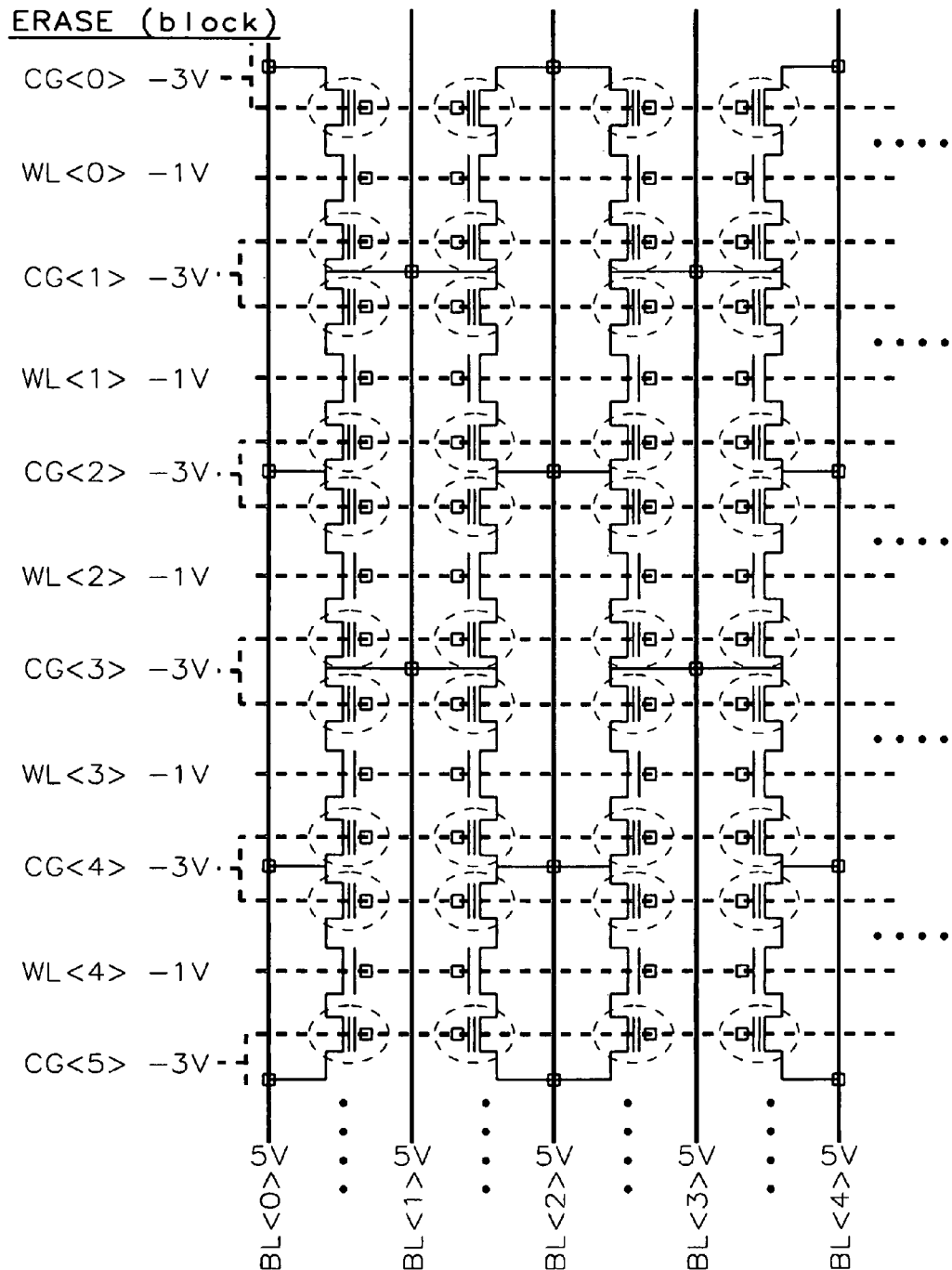

The program operation condition is the same as in the prior art shown in FIG. 12, the erase (2bit) condition is the same as in the prior art shown in FIG. 13, and the erase (block) condition is the same as in the prior art shown in FIG. 14.

Figure 2A:
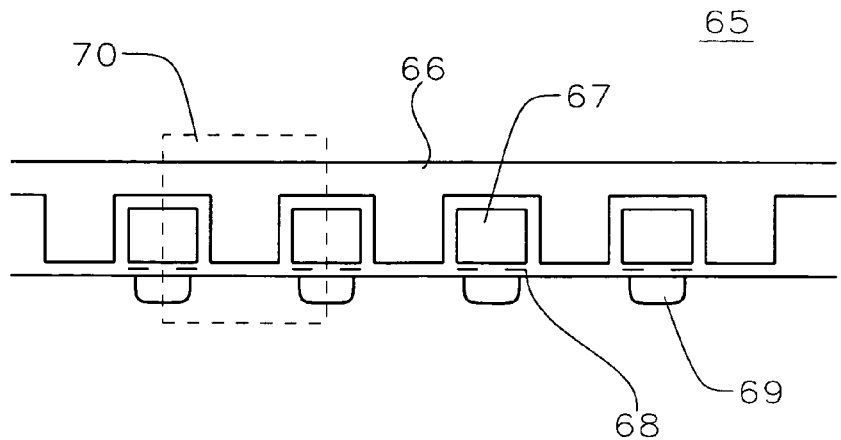
FIG. 2A is a cross-sectional representation of a diffusion bit array of the prior art.
Figure 2B:
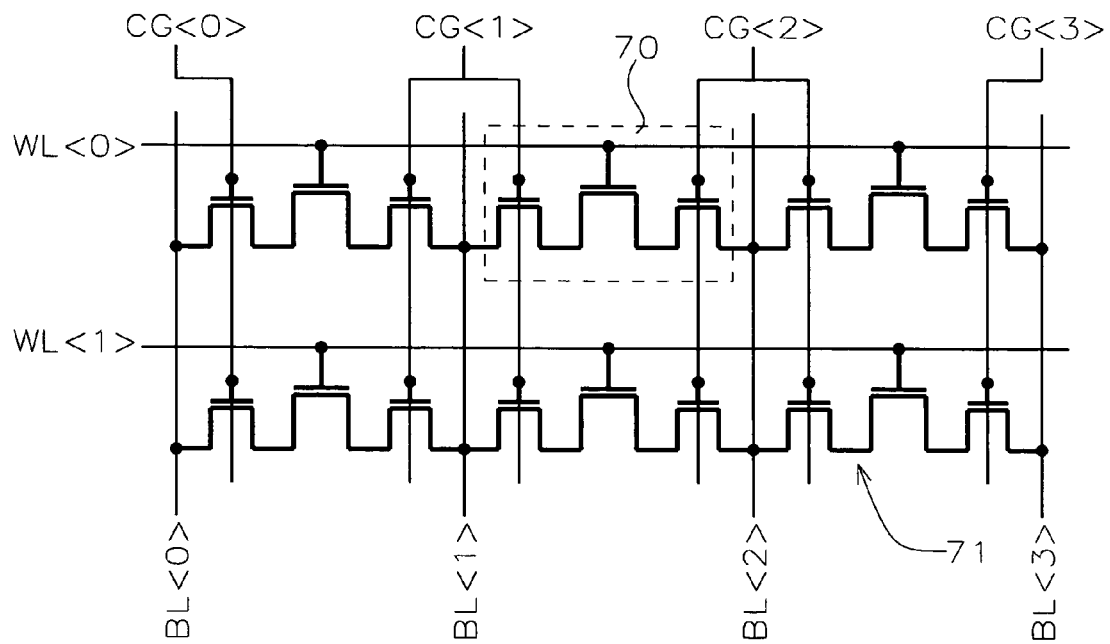
FIG. 2B is a schematic representation of the diffusion bit array of FIG. 2A.
Figure 3:
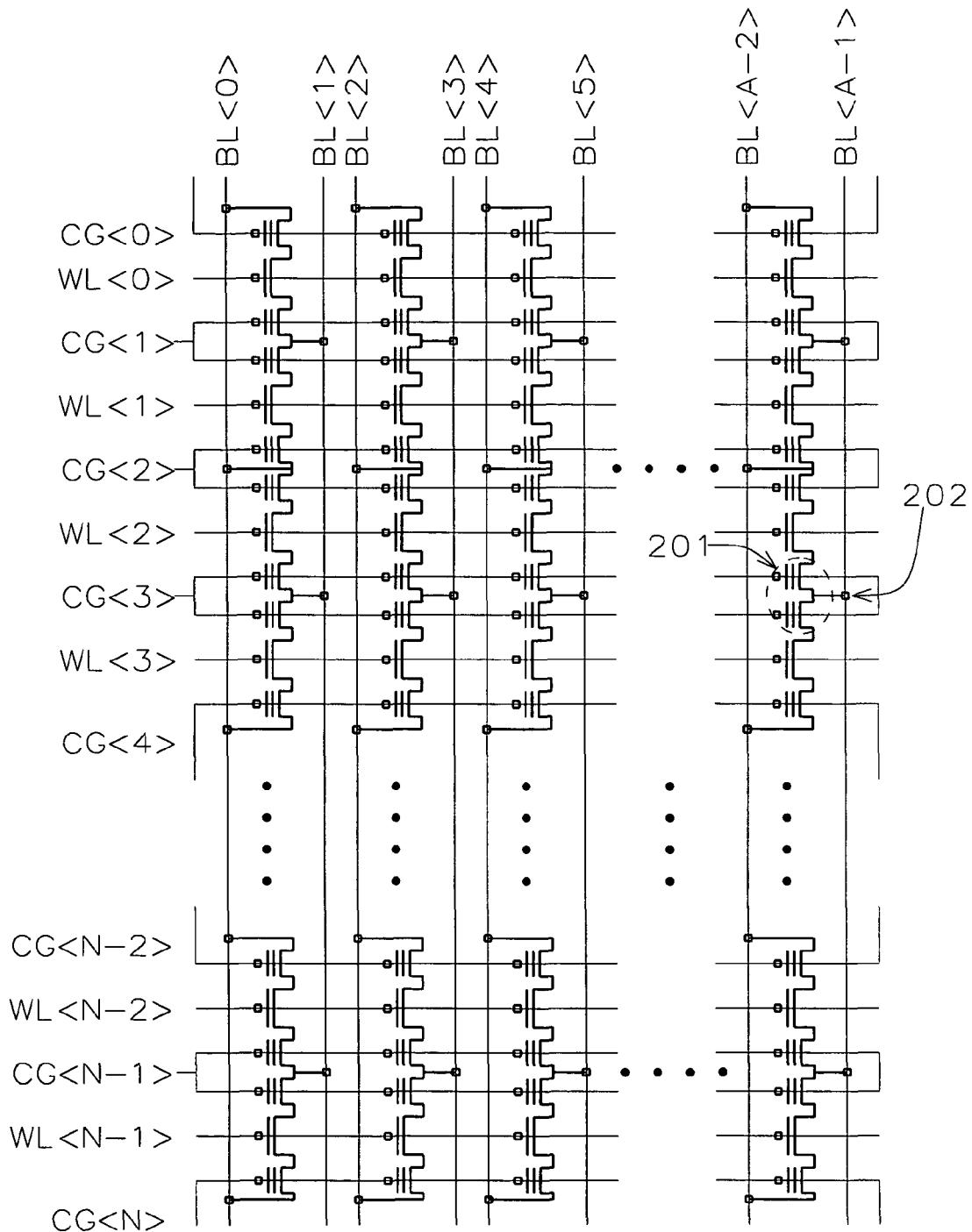
FIG. 3 is a schematic representation of a first metal bit array of the prior art.
Figure 4:
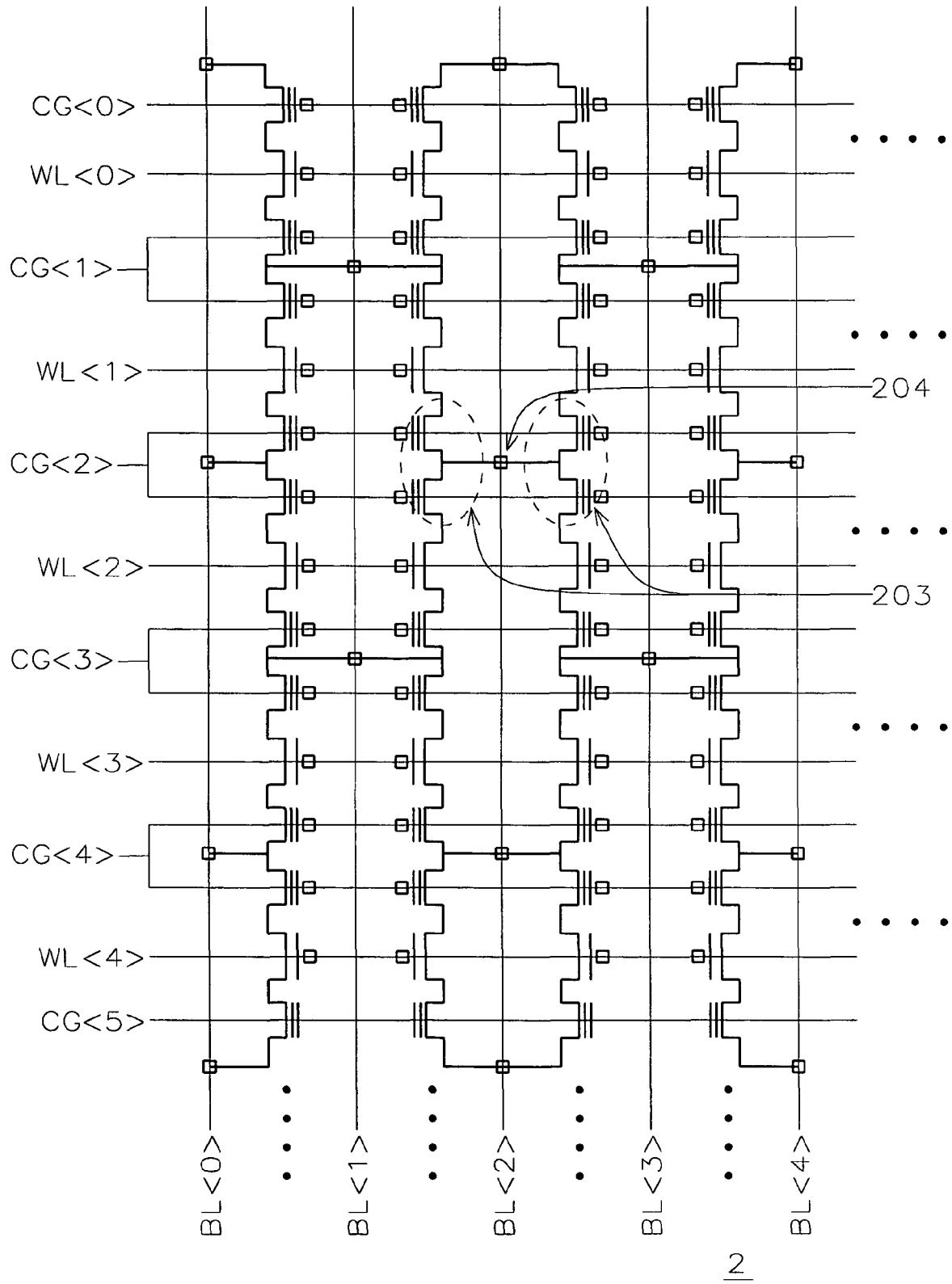
FIG. 4 is a schematic representation of a second metal bit array of the prior art.
Figure 5:
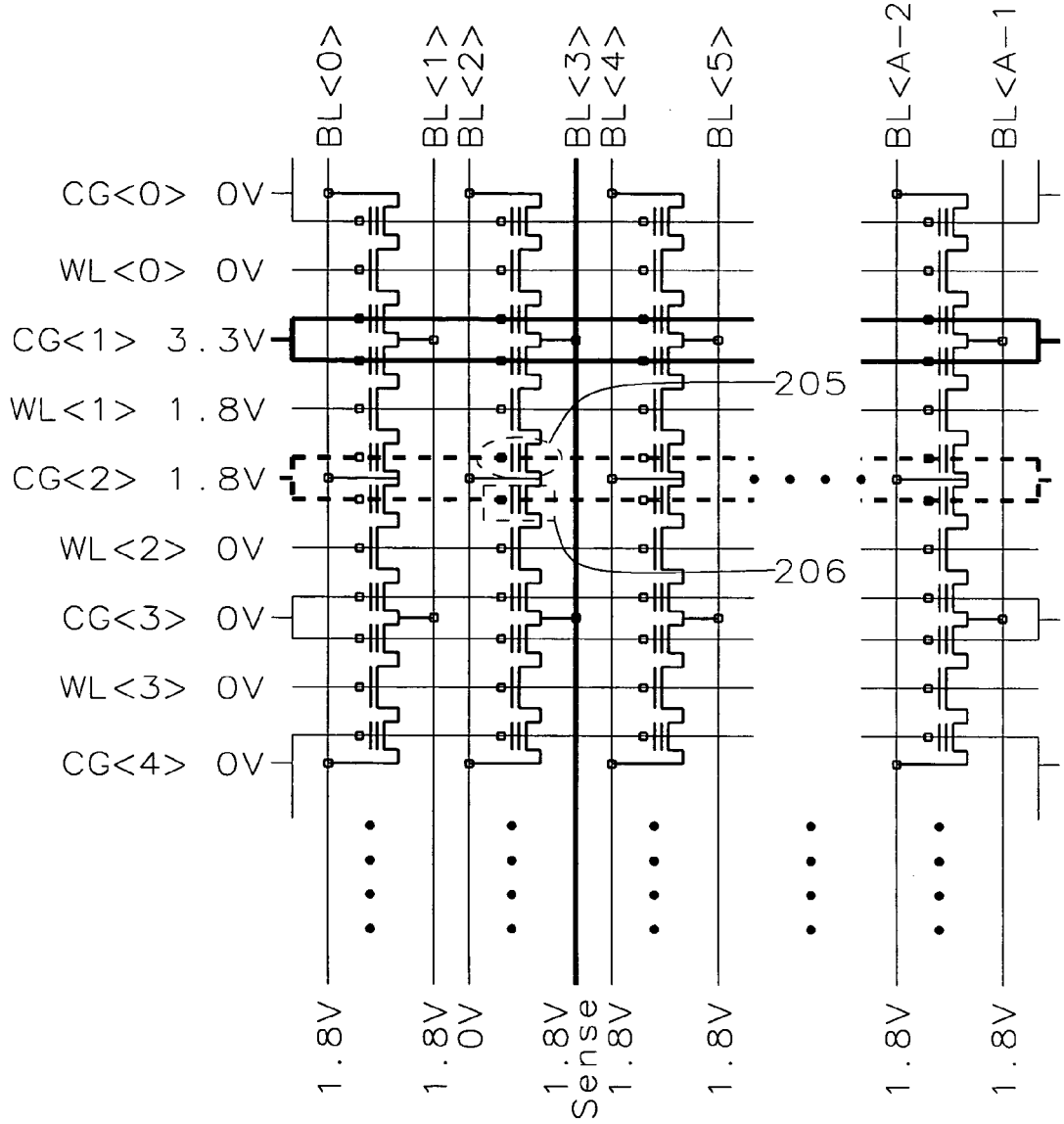

The memory array dividing approach described above is also applicable to a twin MONOS diffusion bit array shown in FIGS. 2A-B (figure not shown).

Memory controller 10 controls the memory 9 inside the application system 13 as shown in FIG. 17. Memory array 1 shown in FIG. 15 and memory array 2 shown in FIG. 16 are used for memory module 9 shown in FIG. 17. The required cycle time of the memory 9 is different in each application system 13. If the required cycle time of the memory 9 is short, the memory array size should be small and the operation method in the present invention is effective. Furthermore, the stitch needs to be utilized to minimize the total RC constant of the word gate and the control gate to achieve high-speed operation. On the other hand, if the required cycle time of the memory 9 is not severe, the array size can be big and the stitch may not be necessary. Depending on the requirement from the actual application, the operation method in the present invention and the conventional techniques for high-speed operation need to be utilized flexibly with optimization.

Figure 18:
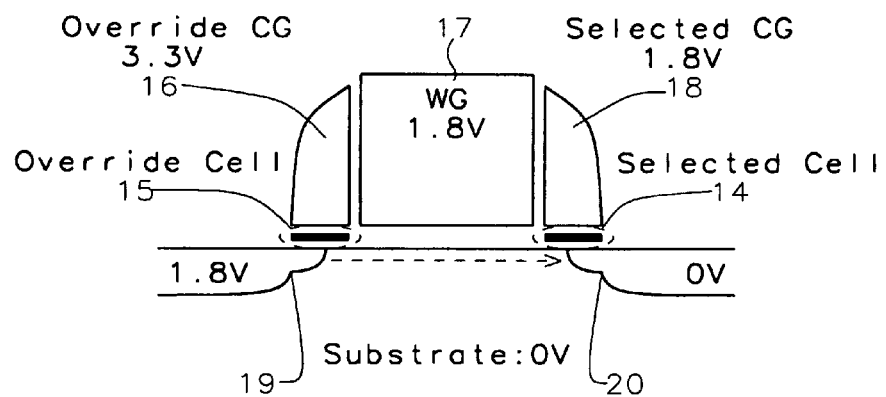
FIG. 18 is a representation of the read condition voltage of the prior art.

FIG. 18 illustrates the read voltage condition in the prior art. CG select 18 voltage is 1.8V, CG override 16 voltage is 3.3V. The bit line at the override side 19 is precharged at 1.8V and the BL at the select side 20 is set at 0V. After CG voltages and BL voltages are set, WL 17 voltage is set at 1.8V and read operation starts. The voltage level of the precharged bit line at the override side is detected by the sense amplifier to check the data in the selected cell 14. Thus the data stored in the selected cell 14 can be detected. The data stored in the overrided cell 15 doesn't affect the read operation for the selected cell because the override voltage applied to the override CG 16 is high enough to make the conductive channel under the overrided CG 16. If the override voltage is not high enough, the cell current is affected by the Vth of the overrided cell 15. That results in an error of the read operation. For example, if the Vth of the overrided cell 15 is high and the override voltage in not high enough, the cell current doesn't flow and the voltage level of the precharged bit line 19 doesn't change in spite of the Vth of the selected cell 14. That is, the detected data of the selected cell 14 always becomes "0". To avoid such errors, the override voltage needs to be high enough.

Figure 19A:
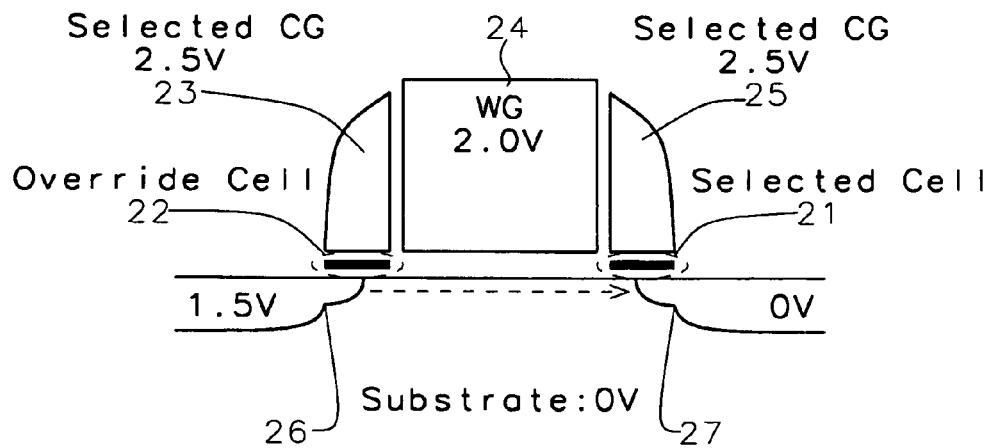
FIGS. 19A and 19B are representations of the override method of the second preferred embodiment of the present invention.
Figure 19B:
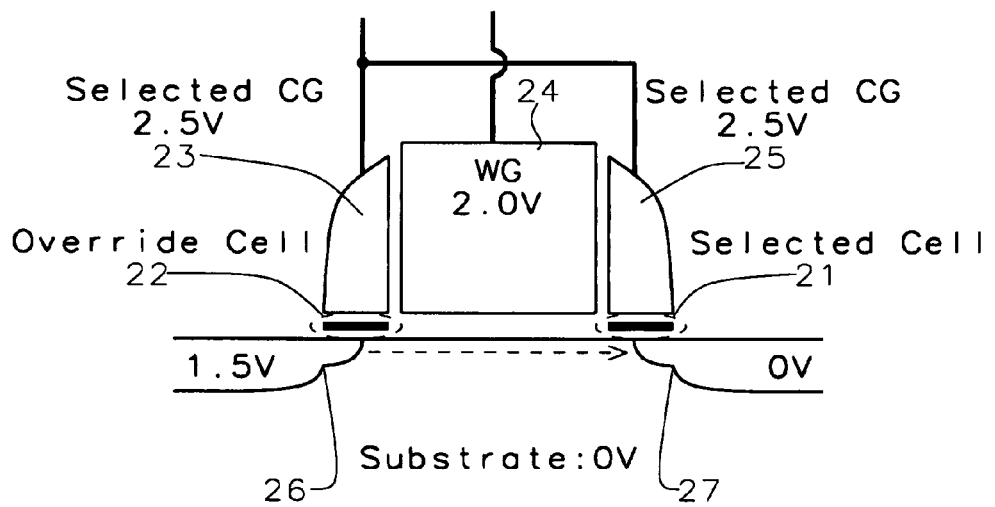

Though the high enough override CG voltage is used for override in the prior art shown in FIG. 18, another override method is used in the second embodiment of the present invention shown in FIG. 19A. In the present invention, 2.5V is applied to both CGs 23 and 25. That is, override voltage for the overrided cell 22 is eliminated. That is as if all the control gates were connected together as shown in FIG. 19B. However, the word gate 24 voltage can be applied independently of the control gate voltage. This condition is achieved electrically by applying the same voltage to all the control gates. The BL at the override side 26 is set at 1.5V (not precharge) and the BL at the select side 27 is set at 0V. After the CG voltage and BL voltage are set, WL is set at 2.0V. In the present invention, DIBL (Drain Induced Barrier Lowering) is utilized for override. Because the Vth of the override CG 23 is lowered enough by DIBL owing to the bit line voltage (1.5V), the read operation for the selected cell 21 can be done without error. In the present invention, the operation and peripheral circuit can be simplified because the same voltage can be applied to the override CG and the select CG; that is, override voltage can be eliminated.

Figure 1A:
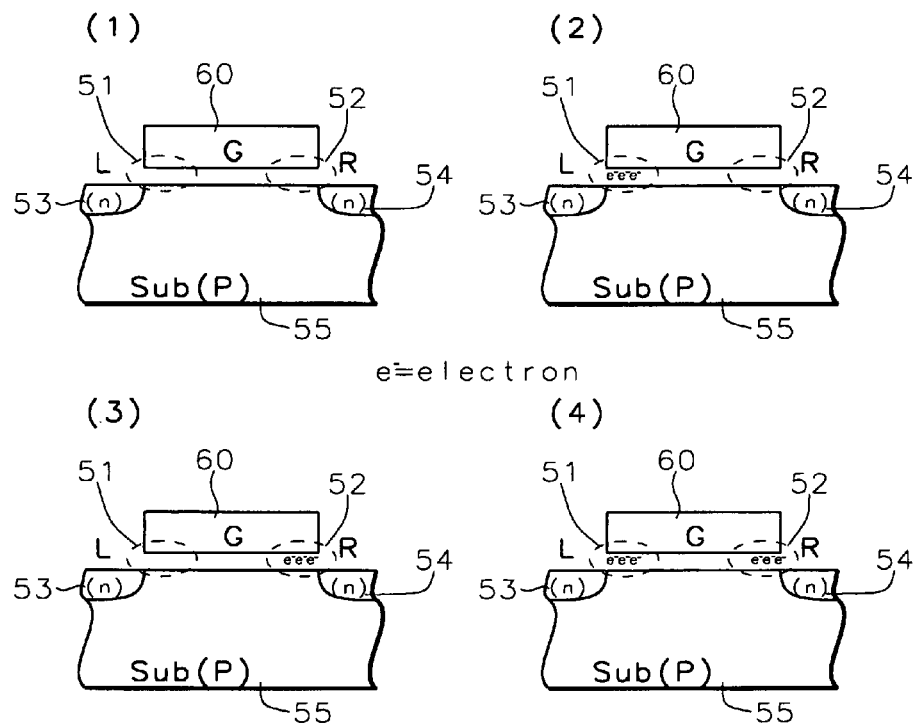
FIGS. 1A through 1C are cross-sectional representations of a memory gate of the prior art.
Figure 1B:
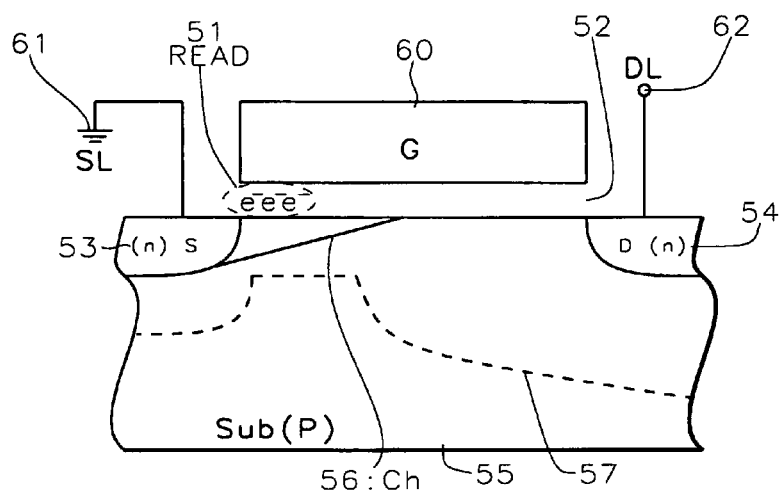
Figures 1C, 1D:
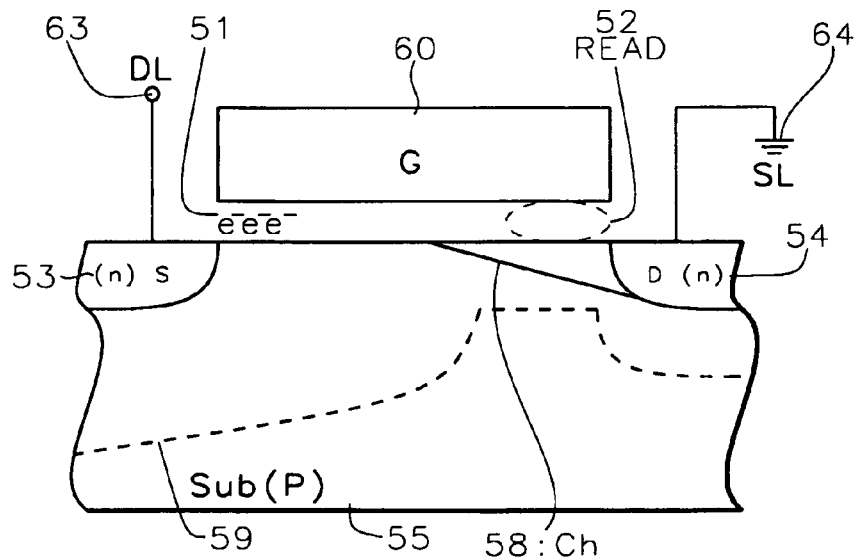
FIG. 1D shows the read method of the prior art of FIGS. 1A through 1C.
Figure 20A:
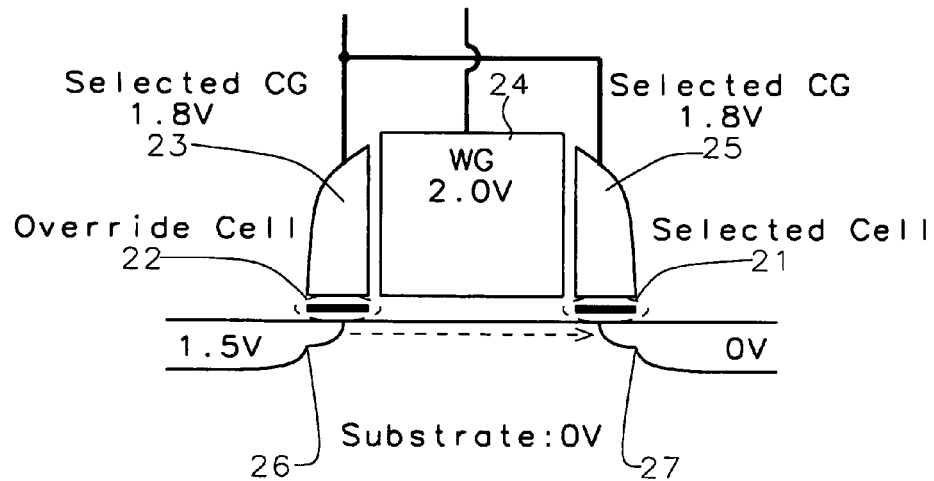
FIGS. 20A through 20D and show the read operation modes of the second preferred embodiment of the present invention.
Figure 20B:
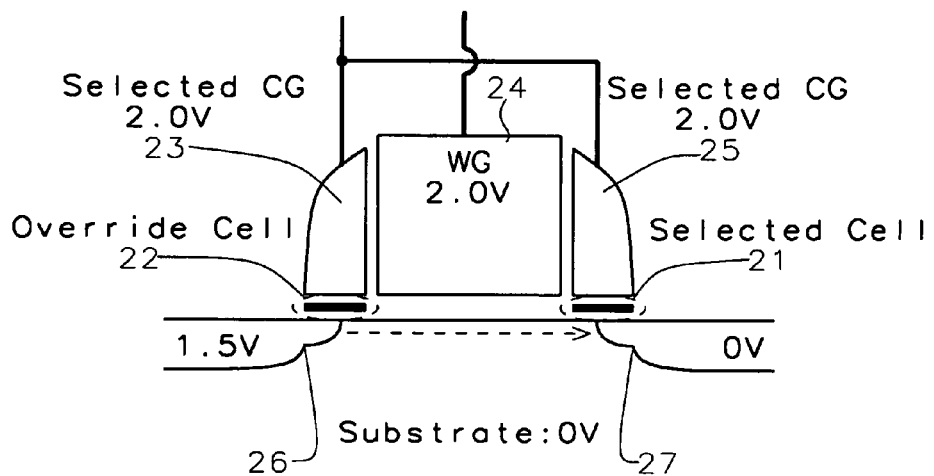
Figures 20C, 20D:
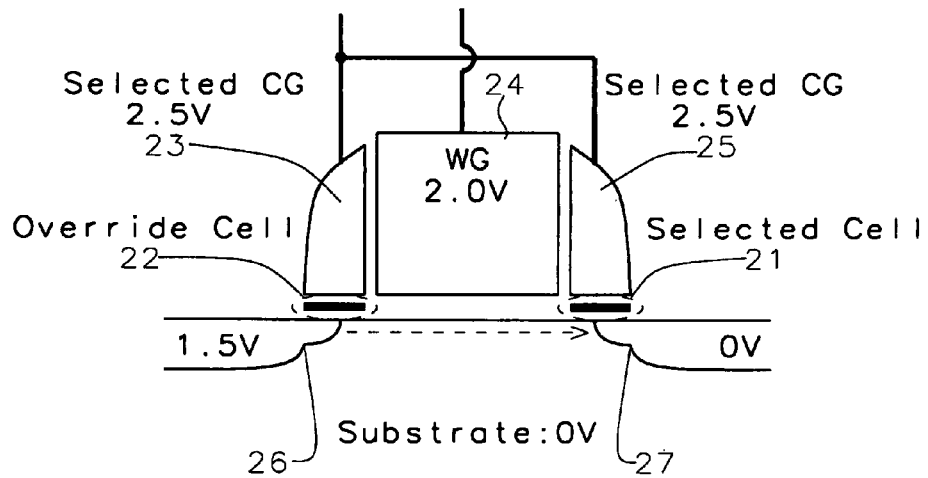

Read operation modes of the second embodiment of the present invention are shown in FIG. 20. Three modes A-C can exist, as shown in FIG. 20A-C and in the table in FIG. 20D. All reference numbers are the same in FIGS. 20A-C as in FIGS. 19A-B. Mode B is the same as in the prior art as shown in FIGS. 1A-C. In mode A, the control gate voltage (Vcg) is low and ON/OFF ratio is good; that is, the low stand-by current is achievable in mode A. Therefore, mode A is suitable for the mobile application with the low power stand-by mode. In mode B, the word gate and the control gate are connected electrically. The selection of the control gate does not occur in mode B. So, relatively short cycle time and high throughput can be achieved. In mode C, the control gate voltage is higher than the word gate voltage (Vwg) and the high cell current can be attained; that is, high speed operation is achievable in mode C. Furthermore, the selection of the control gate does not occur in mode C. That results in a shorter cycle time and higher throughput compared to the prior art and mode B. Thus, DC bias point for the control gate is variable depending on the requirement from the application.

Figure 21:
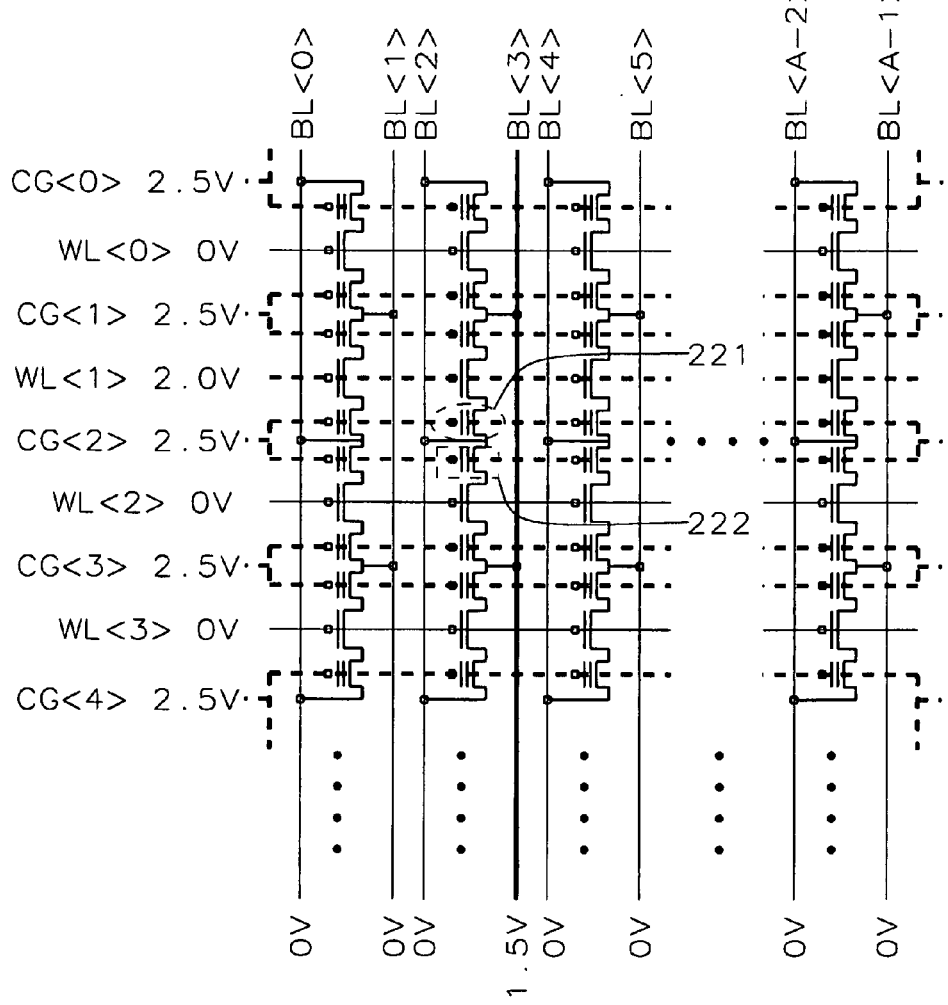
FIG. 21 is a schematic diagram showing the read condition of the second preferred embodiment of the present invention for the metal bit array of FIG. 3.

FIG. 21 shows the read operation voltage condition in a twin MONOS memory array 1. The selected cell 221 is supposed to be read. The cell 222 under the selected control gate CG<2>is not selected. In FIG. 21, all the control gates are set at the select voltage 2.5V. The selected bit line BL<3>is set at 1.5V before the selected word gate WL<1>is turned on. The unselected bit line is set at 0V. After the selected bit line BL<3>is set at 1.5V, the selected word gate WL<1>is set at 2V. The unselected WL's are set at 0V. The current level of the selected bit line BL<2>or BL<3>is detected by a sense amplifier after the selected word gate WL<1>is turned on, and thus the read operation can be accomplished. The current sensing method in the read operation referred to in U.S. Pat. No. 6,631,088 B2 (S. Ogura et al.) is applicable to the read operation of a metal bit twin MONOS array 1. Another sensing method, for example, source follower sensing method, can be also applicable (figure not shown). In the present invention, metal stitch is less important and memory cell area can be saved. Furthermore, in the present invention, the operation cycle time can be short because the control gate voltage set up time is not necessary, and the operation can be simplified because override voltage doesn't exist.

Figure 7:
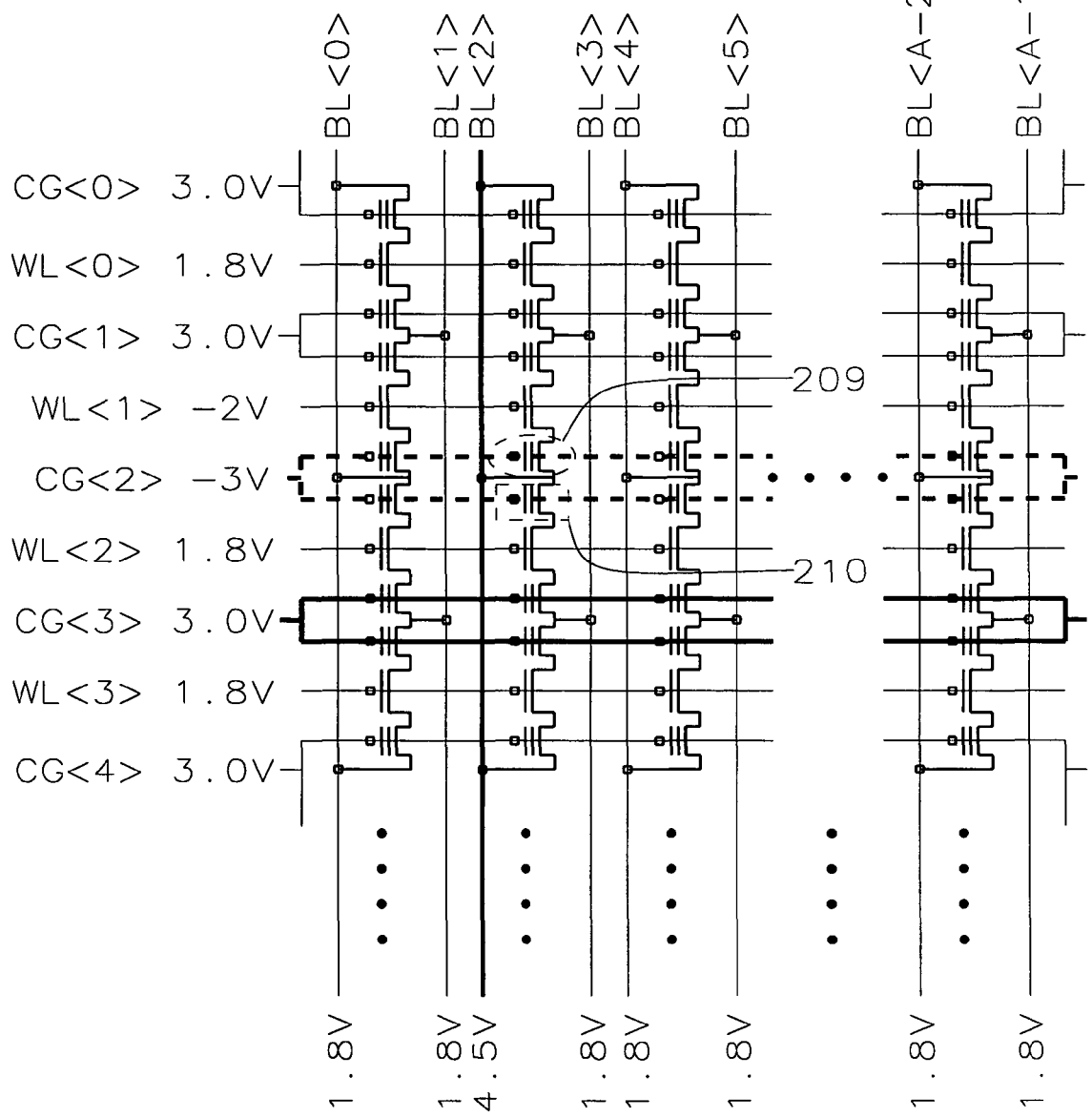
Figure 8:
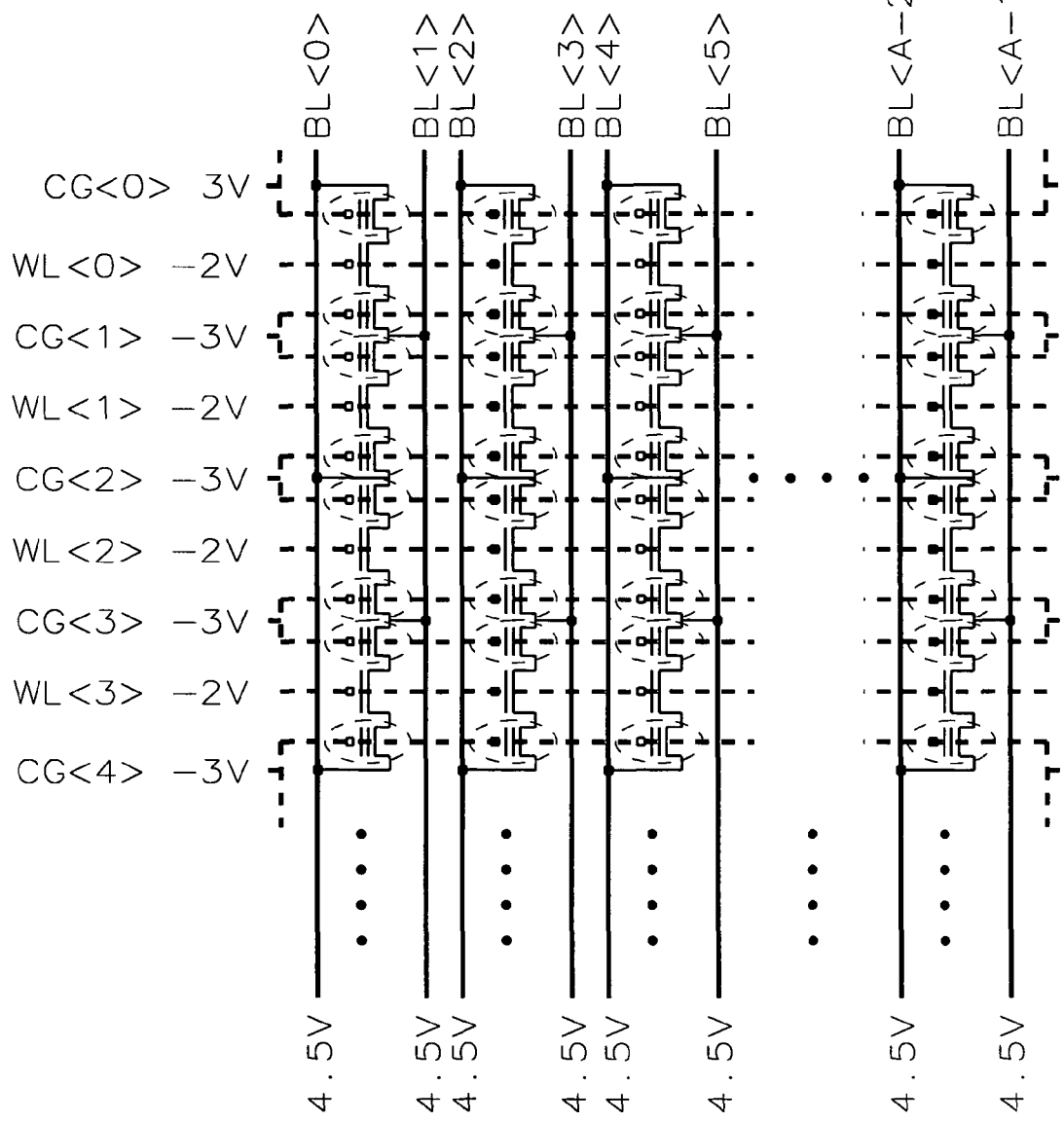
Figure 10:
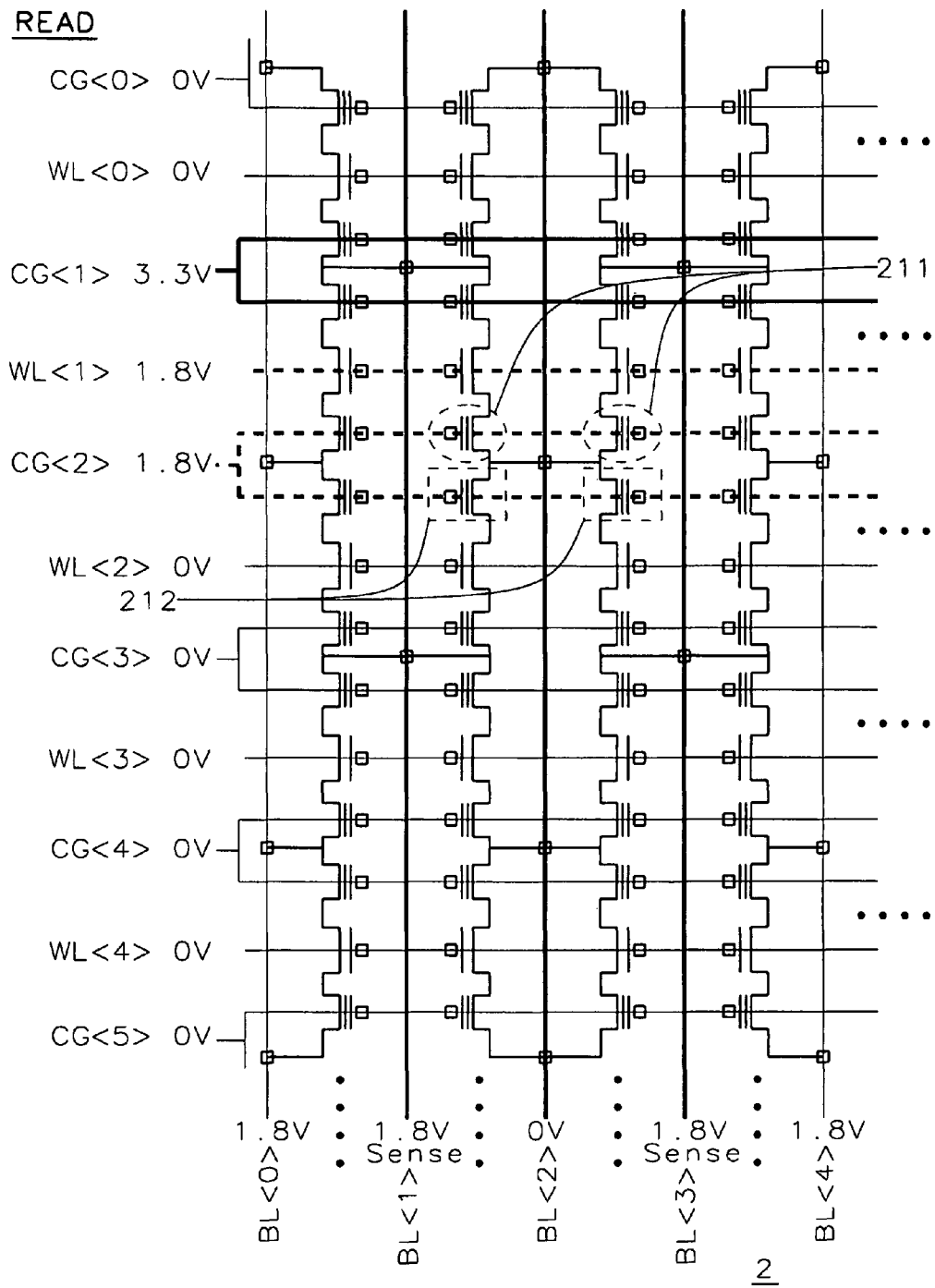

The program operation condition is the same as in the prior art shown in FIG. 6, the erase condition (1 bit) is the same as in the prior art shown in FIG. 7, and the erase (block) condition is the same as in the prior art shown in FIG. 8.

Figure 22:
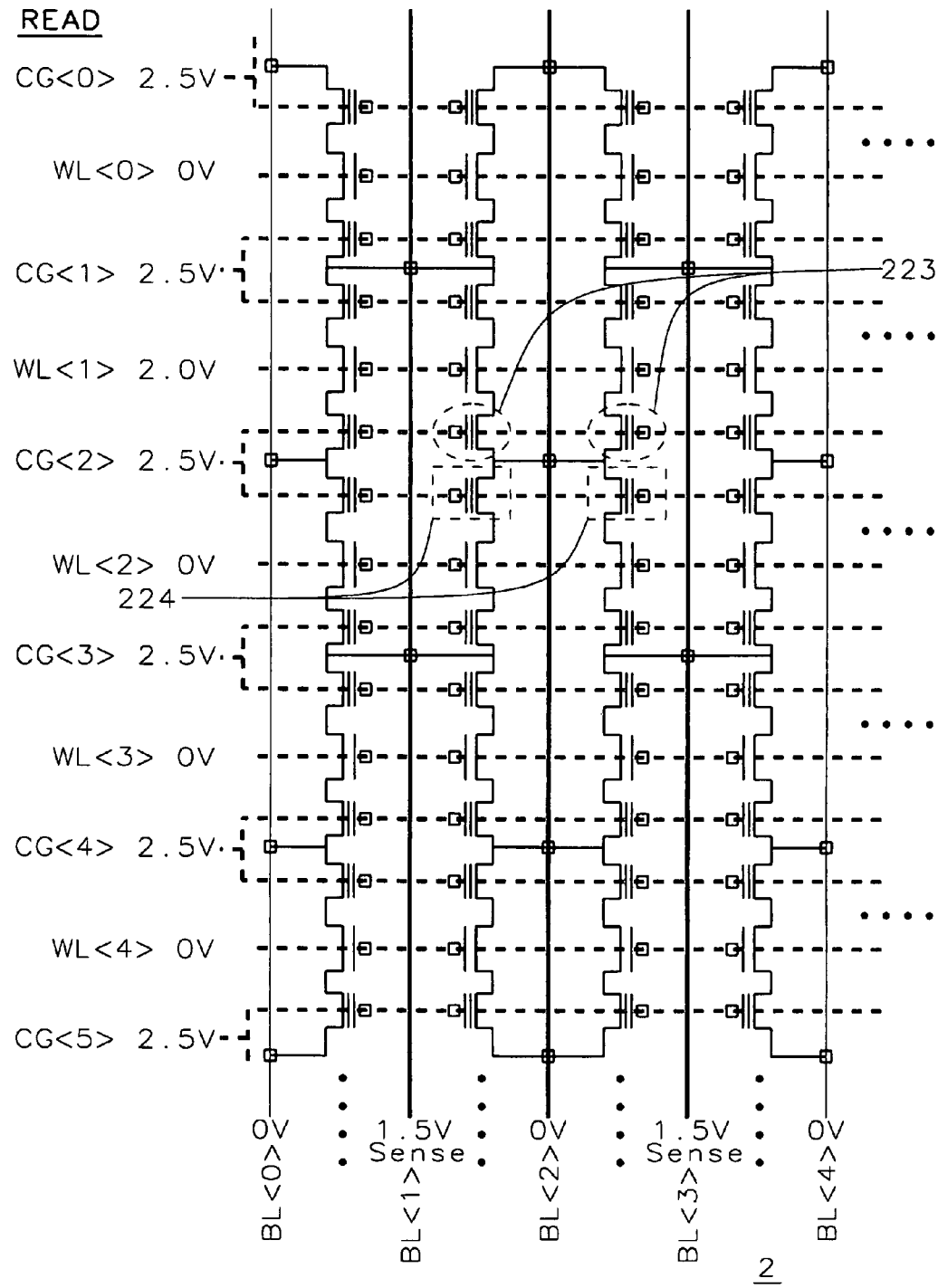
FIG. 22 is a schematic diagram showing the read condition of the second preferred embodiment of the present invention for the metal bit array of FIG. 4.

FIG. 22 shows the read operation voltage condition in a twin MONOS memory array 2. The basic operation method in the prior art is referred to in U.S. Pat. No. 6,469,935 B2 (Y. Hayashi) and U.S. Pat. No. 6,631,088 B2 (S. Ogura et al.). The selected cells 223 are supposed to be read at the same time. The cells 224 under the selected control gate CG<2>are not selected. The first selected bit line BL<2>is set at 0V. The second selected bit line BL<1>and the third selected BL<3>are set at 1.5V before the selected word gate WL<1>is turned on. The unselected bit lines are set at 0V. After the second selected bit line BL<1>and the third selected bit line BL<3>are set at 1.5V, the selected word gate WL<1>is set at 2V. The unselected WL's are set at 0V. The current levels of the second selected bit line BL<1>and the third selected BL<3>are detected by a sense amplifier after the selected word gate WL<1>is turned on, and thus the read operation can be accomplished. The current sensing method in the read operation is referred to in U.S. Pat. No. 6,631,088 B2 (S. Ogura et al.). Another sensing method, for example, source follower sensing method, can be also applicable (figure not shown). In the present invention, metal stitch is less important and memory cell area can be saved. Furthermore, in the present invention, the operation cycle time can be short because the control gate voltage set up time is not necessary and the operation can be simplified because override voltage doesn't exist.

The program operation condition is the same as in the prior art shown in FIG. 12, the erase (2bit) condition is the same as in the prior art shown in FIG. 13, and the erase (block) condition is the same as in the prior art shown in FIG. 14.

The read method described above wherein all the control gates are set at the same voltage is applicable to a twin MONOS diffusion bit array shown in FIG. 2A-B (figure not shown).

Figure 23:
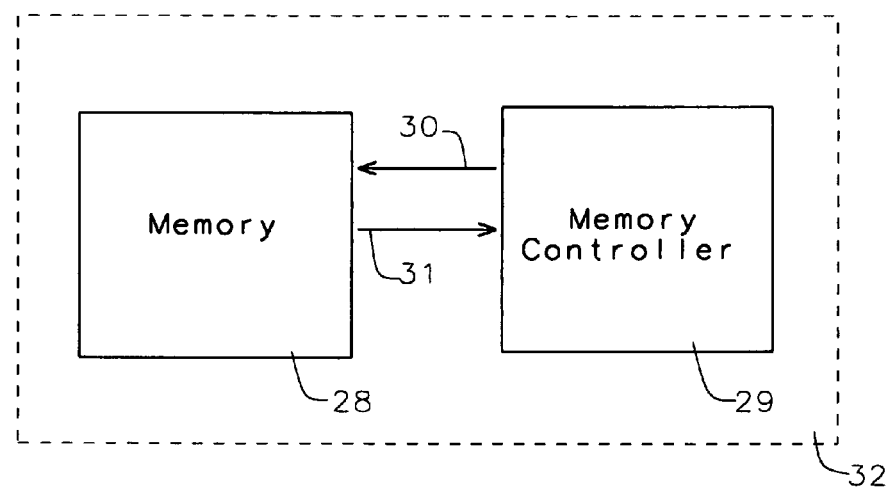
FIG. 23 is a block diagram of the operation of the memory controller in the second preferred embodiment of the present invention.

Memory controller 29 controls the memory 28 inside the application system 32 as shown in FIGS. 23. 30 and 31 illustrate two-way communication between memory 28 and memory controller 29. Memory array 1 and voltage condition shown in FIG. 21 and memory array 2 and voltage condition shown in FIG. 22 are used for memory module 28 shown in FIG. 23. The required cycle time of the memory 28 is different in each application system 32. If the required cycle time of the memory 28 is short, the memory array size should be small and the operation method in the present invention is effective. Furthermore, the stitch needs to be utilized. On the other hand, if the required cycle time of the memory 28 is not severe, the array size can be big and the stitch may not be necessary. Depending on the requirement from the actual application, the operation method in the present invention and the conventional techniques for high-speed operation need to be utilized flexibly with optimization.

FIGS. 23-27 show the third embodiment of high-speed memory operation method using metal bit twin MONOS array where a pair of storage area regions hold complementary bits. Hereinafter, this method is called "complementary method".

Figure 24:
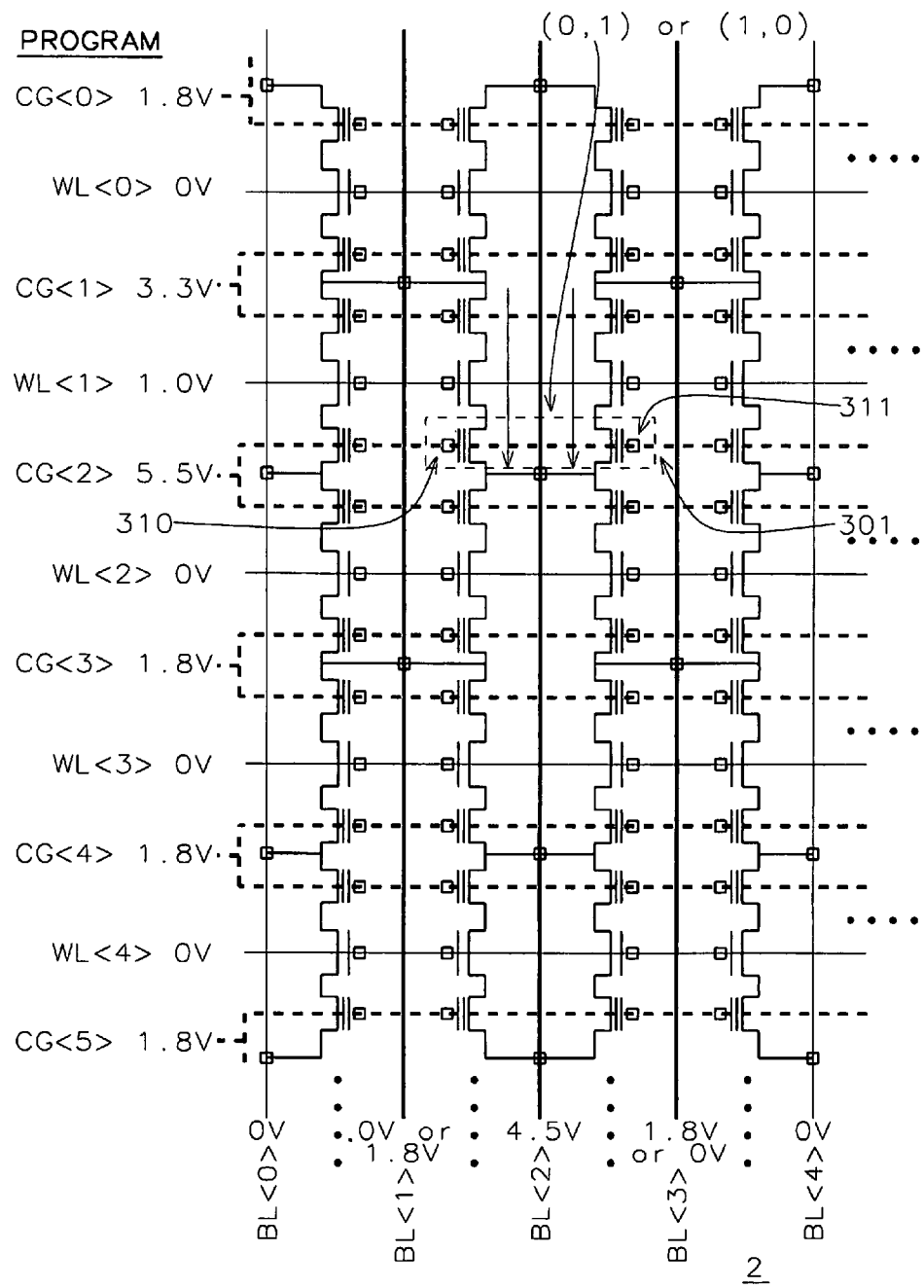
FIG. 24 is a schematic diagram showing the program condition of the third preferred embodiment of the present invention for the metal bit array of FIG. 4.

FIG. 24 shows the voltage condition of program operation in the complementary method where complementary memory cell 301 comprised of a pair of complementary bits is programmed. In the complementary method, one cell of the complementary memory cell 301 is programmed at data "0" and another one cell of the complementary memory cell 301 is programmed at data "1". The programming of data "0" or inhibition of program (data "1") is as described in the prior art of non-complementary method utilizing twin MONOS memory device.

To program data "0" in the left cell 310 and data "1" in the right cell 311, BL<1> is set at 0V, BL<2> is set at 4.5V and BL<3> is set at 1.8V. 4.5V of BL<2> is the BL program voltage and 1.8V of BL<3> is program inhibit voltage. Select control gate CG<2> is set at 5.5V and override control gate CG<1> is set at 3.3V. Finally, selected word gate WL<1> is set at 1.0V from 0V and program operation starts. An electron is injected into the left cell 310 by channel hot electron. On the other hand, electron injection doesn't occur at the right cell 311 because the program inhibit voltage of 1.8V is applied at BL<3>.

To program data "1" in the left cell 310 and data "0" in the right cell 311, BL<1> is set at 1.8V, BL<2> is set at 4.5V and BL<3> is set at 0V. 4.5V of BL<2> is the BL program voltage and 1.8V of BL<1> is program inhibit voltage. Select control gate CG<2> is set at 5.5V and override control gate CG<1> is set at 3.3V. Finally, selected word gate WL<1> is set at 1.0V from 0V and program operation starts. An electron is injected into the right cell 311 by channel hot electron. On the other hand, electron injection doesn't occur at the left cell 310 because the program inhibit voltage of 1.8V is applied at BL<1>.

Figure 25A:
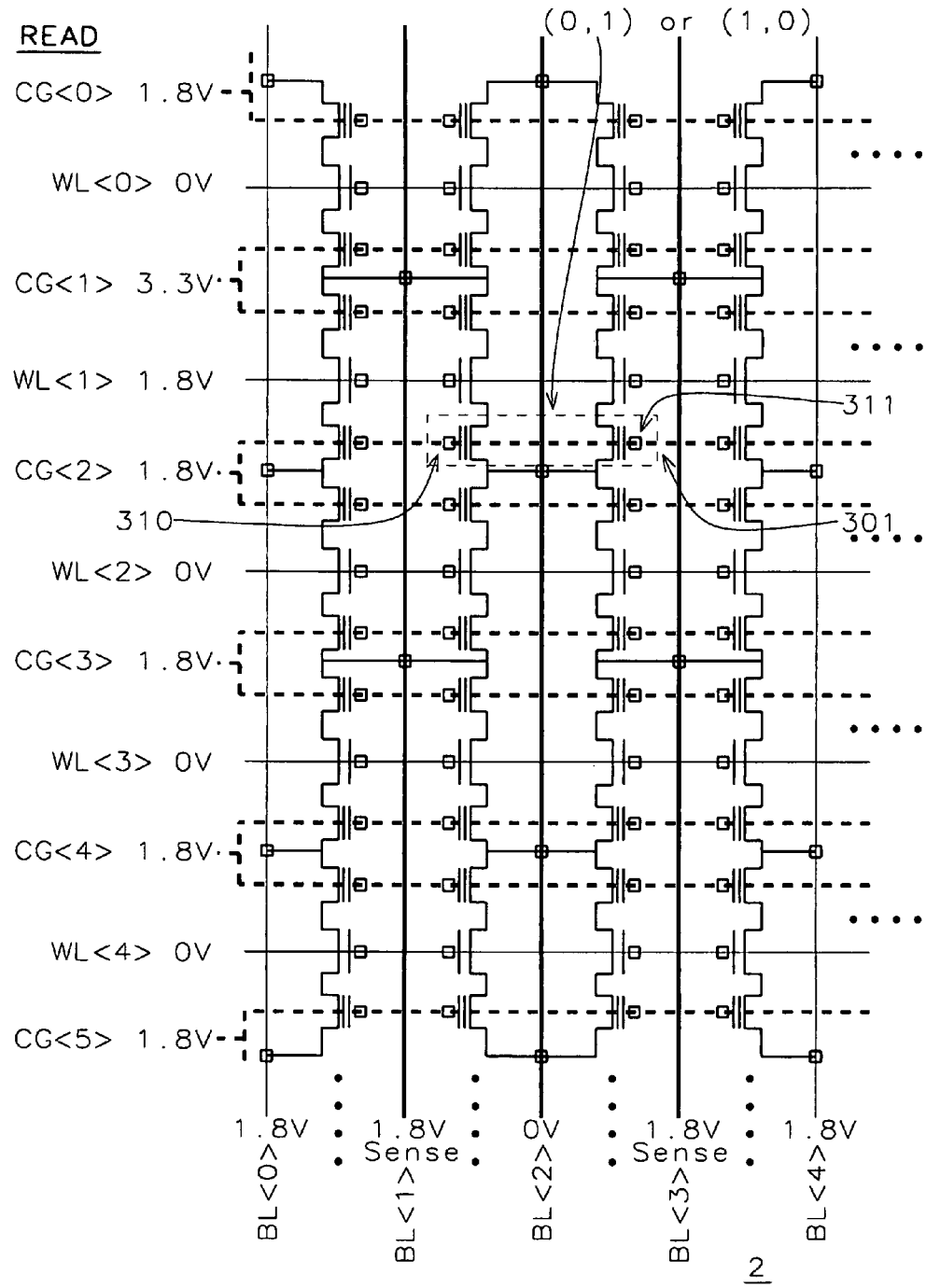
FIG. 25A is a schematic diagram showing the read condition of the third preferred embodiment of the present invention.

FIG. 25A shows the voltage condition of precharge-discharge read operation in the complementary method. The stored data on the left cell 310 and right cell 311 in complementary memory cell 301 are read out at the same time as described in the prior art of precharge-discharge method utilizing a twin MONOS memory device. BL<1> and BL<3> are precharged at 1.8V and connected to the sense amplifier. Selected control gate CG<2> is set at 1.8V, override control gate CG<1> is 3.3V. Finally, selected word gate WL<1> is set at 1.8V from 0V, then read operation starts.

In addition, the other sensing methods such as source follower sensing and current sensing can be utilized in the complementary method.

Figure 25B:
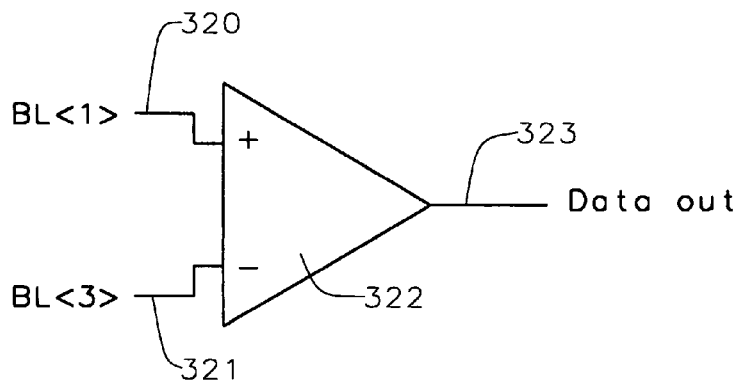
FIG. 25B shows the connection between the selected bit lines and sense amplifier circuit of the third preferred embodiment of the present invention.

FIG. 25B shows the connection between the selected bit lines and sense amplifier circuit 322. Selected bit line pairs BL<1> and BL<3> are connected to the sense nodes 320 and 321 of sense amplifier 322 with complementary signal input 320 and 321.

Figure 25C:
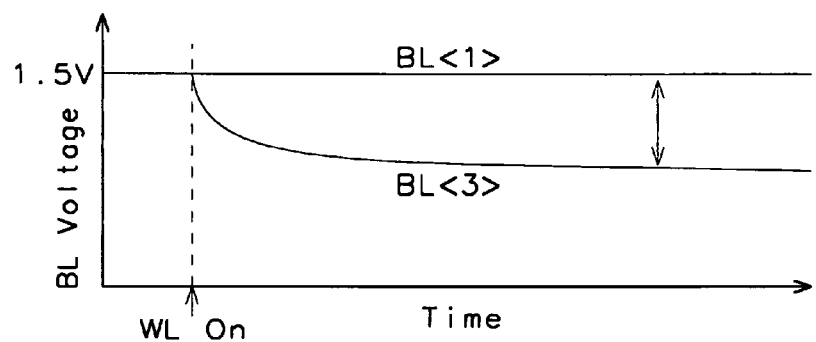
FIGS. 25C and 25D graphically shows the bit line voltage transition in the read operation of the third preferred embodiment of the present invention.

FIG. 25C shows the bit line voltage transition in the read operation of the complementary method. In this case, the left cell 310 has data "0" and the right cell 311 has data "1". The voltage of BL<1> is kept at around 1.8V even after WL is turned on. The voltage of BL<3> starts decreasing after WL is turned on. Then data out 323 becomes "H". Because one of the complementary cells stores the data "0" and one of the bit line voltages is kept at around 1.8V, the signal margin between BL<1> and BL<3> can be big in the early phase of sensing. This results in fast sensing and high-speed operation of the memory chip.

Figure 25D:
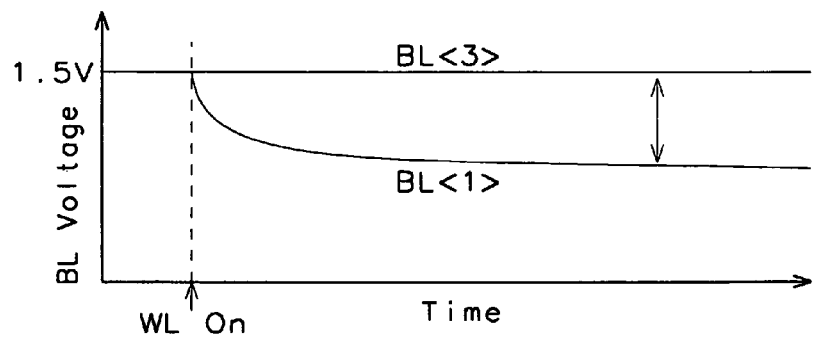

FIG. 25D shows the bit line voltage transition in the read operation of the complementary method. In this case, the left cell 310 has data "1" and the right cell 311 has data "0". The voltage of BL<3> is kept at around 1.8V even after WL is turned on. The voltage of BL<1> starts decreasing after WL is turned on. Then data out 323 becomes "L". Because one of the complementary cells stores the data "0" and one of the bit line voltages is kept at around 1.8V, the signal margin between BL<1> and BL<3> can be big in the early phase of sensing. This results in fast sensing and high-speed operation of the memory chip.

In the complementary method, one of the cells in the complementary cell 301 functions as a reference cell of the corresponding cell in the read operation. This reference cell tracks the cycling characteristics of its corresponding cell because the pairs of cells 310 and 311 undergo the same number of program-erase cycles. Temperature and parasitics are also closely matched between the pair of cells.

Figure 11:
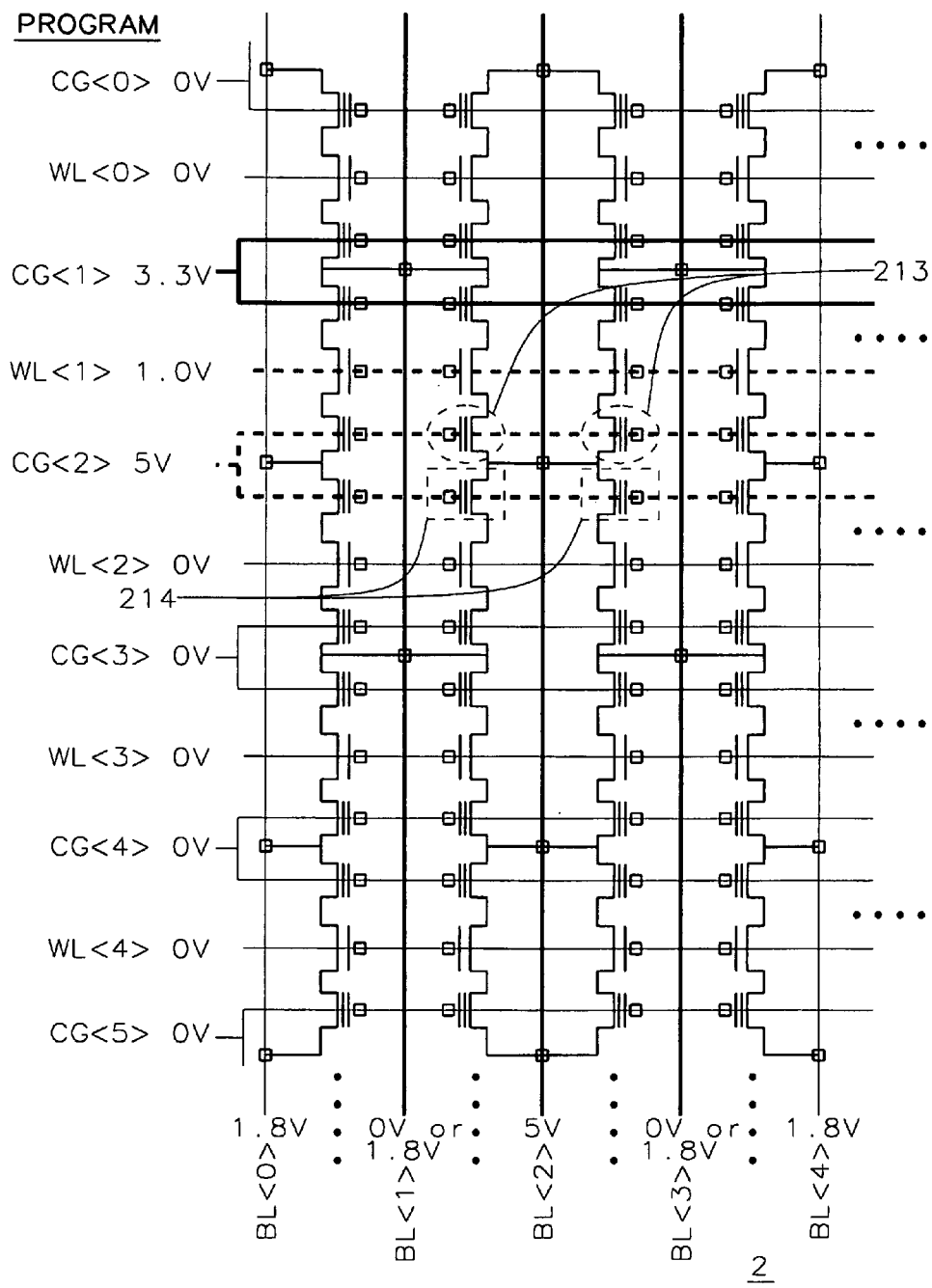

Although the voltage condition of read operation shown in FIG. 25A is the same as the prior art shown in FIG. 11, the high-speed read operation methods shown in FIG. 16 and FIG. 22 are applicable to the complementary method.

Figure 26:
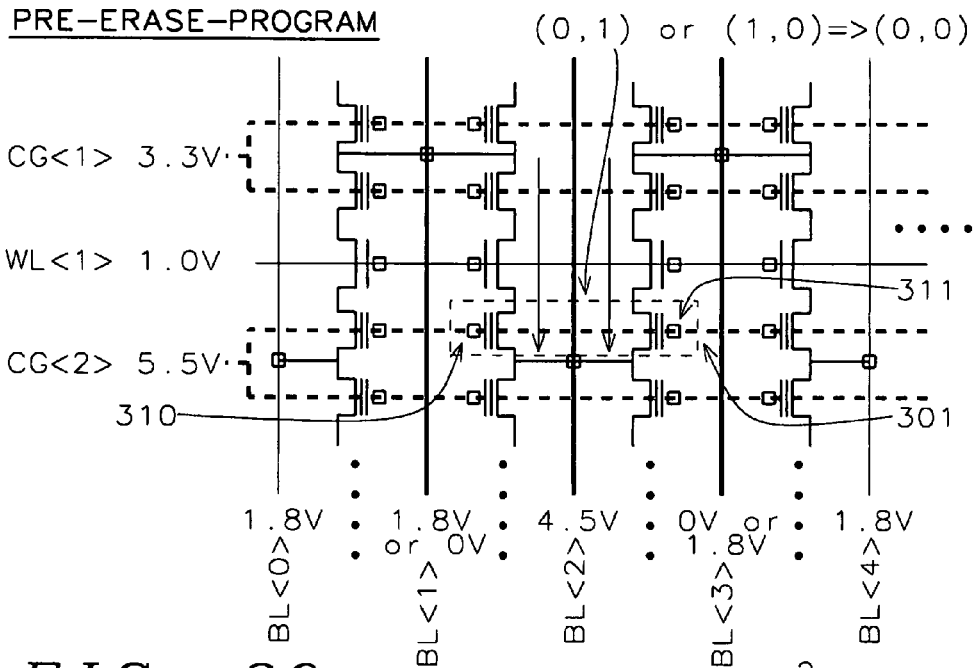
FIG. 26 is a schematic diagram showing the pre-erase-program condition of the third preferred embodiment of the present invention.

FIG. 26 shows the voltage condition of the pre-erase-program operation which should be done before an erase operation. In the complementary method, one of the complementary cells 301 stores data "0" and another one of the complementary cells 301 stores data "1". That is, an electron is trapped at one of the complementary cells 301 which stores data "0". On the other hand, an electron is not trapped at the cell which stores data "1". If the erase voltage is applied to the complementary cell 301 without any treatments, one of the cells which stores data "1" may be over erased and further compounded with cycling. To avoid over erase, pre-erase-program operation may be used.

The selected control gate is set at 5.5V and the override control gate is set at 3.3V. The BL voltage is determined depending on the data status in the complementary cell 301 with program verify operations. In the case that the left cell 310 stores data "0" and the right cell 311 stores data "1", BL<1> is set at the program inhibit voltage of 1.8V and BL<3> is set at 0V so that only the right cell 311 can be programmed. And, in the case that the left cell 310 stores data "1" and the right cell 311 stores data "0", BL<1> is set at 0V and BL<3> is set at the program inhibit voltage of 1.8V so that only the left cell 310 can be programmed. After the pre-erase-program treatment, both cells in the complementary cell 301 store data "0", that is, electrons are trapped in cell 310 and cell 311.

In this pre-erase-program operation, both of the cells 310 and 311 in the complementary cell 301 may be pre-erase-programmed without verification if over programming of the data "0" bit is not an issue.

Figure 27:
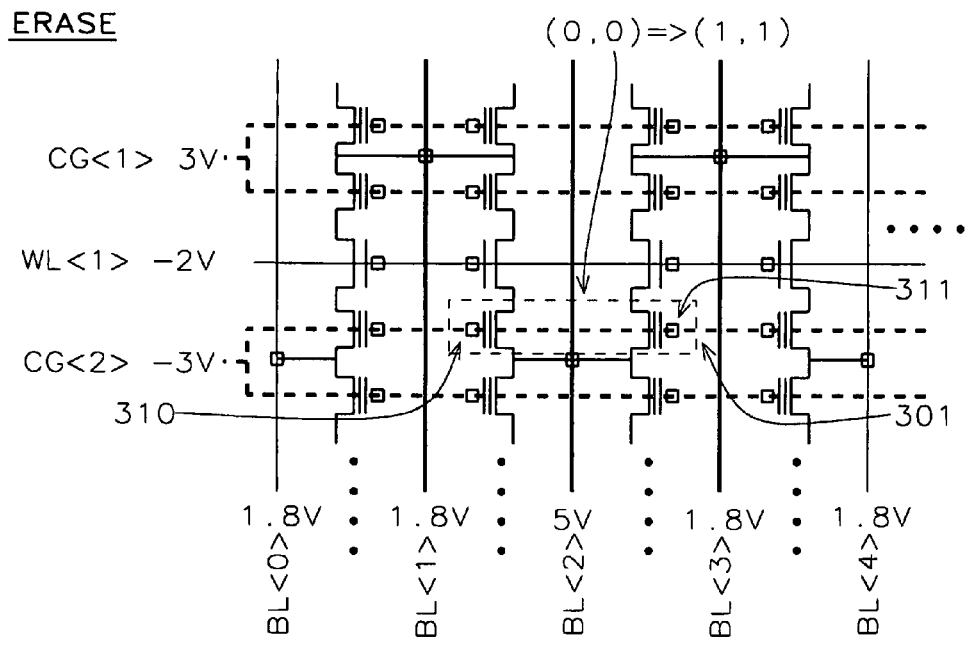
FIG. 27 is a schematic diagram showing the erase condition of the third preferred embodiment of the present invention.

After pre-erase-program operation, an erase operation is performed. FIG. 27 shows the voltage condition of the erase mode. As shown in the prior art, selected control gate CG<2> is set at around −3V and unselected control gate CG<1> is set at 0V. Selected word gate WL<2> is set at around −2V. Then selected bit line BL<2> is set at the erase voltage of around 5V. Thus the complementary cell 301 can be erased by hot hole injection and other erase methods as described in the prior art. For the complementary method, not only two bit erase, but also block erase is possible.

The value of the voltages described above may be modified to have another value in the practical application in the present invention. The same thing goes with the procedure of the operations.

While the invention has been particularly shown and described with reference to the preferred embodiments thereof, it will be understood by those skilled in the art that various changes in form and details may be made without departing from the spirit and scope of the invention.

What is claimed is:

1. A twin MONOS memory array comprising:
   a plurality of memory cells two dimensionally disposed in a first direction and in a second direction wherein each pair of said memory cells comprises a control gate pair having an ONO memory element thereunder, wherein each control gate is shared by two word gates, wherein a first control gate in said control gate pair is accessed by a first of said two word gates adjacent to said first control gate and wherein a second control gate in said control gate pair is accessed by a second of said two word gates adjacent to said second control gate;

a plurality of bit lines extending in said first direction;

a plurality of said word gates extending in said second direction;

a plurality of said control gates extending in said second direction; and structures for applying a select voltage to some of said control gate pairs, for applying an override voltage to others of said control gate pairs, for applying word gate voltages, and for applying bit line voltages wherein said memory array is divided into two or more virtual banks of pairs of memory cells wherein control gates sharing a word line are in different virtual banks, wherein at a given time, one of said virtual banks is selected and all other of said virtual banks are unselected, wherein control gate pairs in said selected one of said virtual banks are preset to a select voltage prior to reading any memory cell and wherein control gate pairs in all other unselected said virtual banks are preset to an override voltage prior to reading any memory cell and wherein reading a memory element in said selected virtual bank requires setting only word gate voltages and bit line voltages.

2. The memory array according to claim 1 wherein said select voltage is 1.8V and said override voltage is 3.3V.

3. The memory array according to claim 1 wherein a memory cell to be accessed is defined by a selected word gate and a selected bit line and wherein all other word gates and bit lines are unselected and wherein a selected said word gate is set to 2V, a selected said bit line is set to 1.8V, and unselected bit lines are set to 0V.

4. The memory array according to claim 1 wherein access to a memory cell in one of said unselected virtual banks requires presetting control gate pairs in said one of said unselected virtual banks to said select voltage and presetting control gate pairs in said selected virtual bank to said override voltage so that said selected virtual bank becomes an unselected virtual bank and said one of said unselected virtual banks becomes said selected virtual bank.

5. The memory array according to claim 1 wherein a first access time is required to access a memory cell in said selected virtual bank and wherein a second access time greater than said first access time is required to access a memory cell in said unselected virtual bank because a control gate switching time is required.

6. The memory array according to claim 1 wherein said memory array is a metal bit twin MONOS array.

7. The memory array according to claim 1 wherein said memory array is divided into two virtual banks of memory cells wherein a first virtual bank contains even-numbered control gate pairs and wherein a second virtual bank contains odd-numbered control gate pairs.

8. The memory array according to claim 1 wherein a first access time is required to access a memory cell in said unselected virtual bank and wherein a second access time is required to access a memory cell in said selected virtual bank wherein system codes are stored in a system code structure in one of said virtual banks so that said second access time is not greater than said first access time.

9. A twin MONOS memory array comprising:

a plurality of memory cells two dimensionally disposed in a first direction and in a second direction wherein each pair of said memory cells comprises a control gate pair having an ONO memory element thereunder, wherein each control gate is shared by two word gates, wherein a first control gate in said control gate pair is accessed by a first of said two word gates adjacent to said first control gate and wherein a second control gate in said control gate pair is accessed by a second of said two word gates adjacent to said second control gate;

a plurality of bit lines extending in said first direction;

a plurality of said word gates extending in said second direction;

a plurality of said control gates extending in said second direction; and structures for applying an intermediate voltage to said control gate pairs, for applying word gate voltages, and for applying bit line voltages wherein all of said control gates are connected together electrically wherein all said control gates are preset to an intermediate voltage and wherein access of a memory element is done by word gate voltages and bit line voltages controlled independently of said control gate voltage.

10. The memory array according to claim 9 wherein said intermediate voltage is about 2.5V.

11. The memory array according to claim 10 wherein a memory cell to be accessed is defined by a selected word gate and a selected bit line and wherein all other word gates and bit lines are unselected and wherein a selected said word gate is set to 2V, a selected said bit line is set to 1.5V, and unselected bit lines are set to 0V.

12. The memory array according to claim 9 wherein said memory array is a metal bit twin MONOS array.

13. A twin MONOS memory array comprising:

a plurality of memory cells two dimensionally disposed in a first direction and in a second direction wherein each pair of said memory cells comprises a control gate pair having an ONO memory element thereunder, wherein each control gate is shared by two word gates, wherein a first control gate in said control gate pair is accessed by a first of said two word gates adjacent to said first control gate and wherein a second control gate in said control gate pair is accessed by a second of said two word gates adjacent to said second control gate;

a plurality of bit lines extending in said first direction;

a plurality of said word gates extending in said second direction;

a plurality of said control gates extending in said second direction; and structures for applying an intermediate voltage to said control gate pairs, for applying word gate voltages, and for applying bit line voltages, wherein said memory array is divided into two virtual banks of memory cells wherein a first virtual bank contains even-numbered control gate pairs and wherein a second virtual bank contains odd-numbered control gate pairs, wherein at a given time, one of said virtual banks is selected and the other of said virtual banks is unselected, wherein control gate pairs of each cell in said selected one of said virtual banks are preset to a select voltage prior to reading any memory cell and wherein control gate pairs in unselected said virtual bank are preset to an override voltage prior to reading any memory cell and wherein reading a memory element in said selected virtual bank requires setting only word gate voltages and bit line voltages.

14. The memory array according to claim 13 wherein said select voltage is 1.8V and said override voltage is 3.3V.

15. The memory array according to claim 13 wherein a memory cell to be accessed is defined by a selected word gate and a selected bit line and wherein all other word gates and bit lines are unselected and wherein a selected said word gate is set to 2V, a selected said bit line is set to 1.8V, and unselected bit lines are set to 0V.

16. The memory array according to claim 13 wherein access to a memory cell in one of said unselected virtual banks requires presetting control gates in said one of said unselected virtual banks to said select voltage and presetting control gates in said selected virtual bank to said override voltage so that said selected virtual bank becomes an unselected virtual bank and said one of said unselected virtual banks becomes said selected virtual bank.

17. The memory array according to claim 13 wherein a first access time is required to access a memory cell in said selected virtual bank and wherein a second access time greater than said first access time is required to access a memory cell in said unselected virtual bank because a control gate switching time is required.

18. The memory array according to claim 13 wherein said memory array is a metal bit twin MONOS array.

* * * * *